United States Patent
Ogasawara et al.

(10) Patent No.: US 9,385,143 B2
(45) Date of Patent: *Jul. 5, 2016

(54) TFT ARRAY SUBSTRATE, AND LIQUID CRYSTAL DISPLAY PANEL

(71) Applicant: Sharp Kabushiki Kaisha, Osaka-shi, Osaka (JP)

(72) Inventors: Isao Ogasawara, Osaka (JP); Takaharu Yamada, Osaka (JP); Masahiro Yoshida, Osaka (JP); Satoshi Horiuchi, Osaka (JP); Shinya Tanaka, Osaki (JP); Tetsuo Kikuchi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 89 days.

This patent is subject to a terminal disclaimer.

(21) Appl. No.: 14/291,937

(22) Filed: May 30, 2014

(65) Prior Publication Data

US 2014/0267969 A1 Sep. 18, 2014

Related U.S. Application Data

(62) Division of application No. 13/138,396, filed as application No. PCT/JP2009/068905 on Nov. 5, 2009, now Pat. No. 8,780,311.

(30) Foreign Application Priority Data

Feb. 16, 2009 (JP) .................................. 2009-033132

(51) Int. Cl.
*G02F 1/1345* (2006.01)
*G02F 1/1339* (2006.01)
(Continued)

(52) U.S. Cl.
CPC ............ *H01L 27/124* (2013.01); *G02F 1/1345* (2013.01); *G02F 1/136286* (2013.01); *G02F 1/1339* (2013.01); *G02F 1/13454* (2013.01)

(58) Field of Classification Search
CPC . G02F 1/1345; G02F 1/1339; G02F 1/13452; G02F 2001/13456; G02F 1/136286; G02F 1/13458; G02F 1/13454; H01L 27/3276; H01L 27/3288
USPC .................................................. 349/149–152
See application file for complete search history.

(56) References Cited

U.S. PATENT DOCUMENTS 6,734,925 B1 5/2004 Lee et al.
6,861,665 B2 3/2005 Kim
(Continued)

FOREIGN PATENT DOCUMENTS

JP H07294870 A 11/1995
JP 09179116 7/1997
(Continued)

OTHER PUBLICATIONS

Office Action for U.S. Appl. No. 13/138,396 mailed May 8, 2013.
(Continued)

*Primary Examiner* — Michael Caley
*Assistant Examiner* — Jia Pan
(74) *Attorney, Agent, or Firm* — Harness, Dickey & Pierce, P.L.C.

(57) ABSTRACT

An embodiment of the present invention provides a TFT array substrate, in which TFT elements and pixel electrodes being correspondingly connected with the TFT elements are arrayed in matrix on an insulating substrate, the TFT array substrate including: gate bus lines made from a first metal material; source bus lines made from a second metal material; pixel electrodes made from a third metal material; a clock wiring made from the first metal material; a branch wiring made from the second metal material; and a connection conductor made from the third metal material, the connection conductor connecting the clock wiring and the branch wiring at a connection part in a periphery area, the connection part having a branch-wiring via hole, which exposes the branch wiring which is covered with the connection conductor, and overlaps the clock wiring at least partly in a plane view.

42 Claims, 17 Drawing Sheets

(51) Int. Cl.
*G02F 1/1362* (2006.01)
*H01L 27/12* (2006.01)

(56) References Cited

U.S. PATENT DOCUMENTS

| | | | |
|---|---|---|---|
| 7,379,148 B2 | 5/2008 | Kim | |
| 7,576,807 B2 | 8/2009 | Chen et al. | |
| 8,780,311 B2 * | 7/2014 | Ogasawara | G02F 1/1345 349/149 |
| 2001/0050799 A1 | 12/2001 | Murade | |
| 2002/0196393 A1 | 12/2002 | Tashiro et al. | |
| 2003/0222311 A1 | 12/2003 | Kim | |
| 2003/0234904 A1 | 12/2003 | Matsuda et al. | |
| 2004/0159839 A1 | 8/2004 | Murade | |
| 2004/0160399 A1 | 8/2004 | Murade | |
| 2005/0023521 A1 | 2/2005 | Murade | |
| 2005/0263762 A1 | 12/2005 | Kim | |
| 2006/0022201 A1 * | 2/2006 | Kim | G02F 1/13454 257/72 |
| 2006/0177770 A1 * | 8/2006 | Kim | H01L 21/84 430/296 |
| 2006/0193170 A1 | 8/2006 | Murade | |
| 2007/0153167 A1 | 7/2007 | Jang et al. | |
| 2008/0007683 A1 * | 1/2008 | Makida | G02F 1/13452 349/139 |
| 2008/0259237 A1 | 10/2008 | Kim | |
| 2009/0016001 A1 | 1/2009 | Miyakawa et al. | |
| 2009/0091671 A1 | 4/2009 | Tsubata et al. | |
| 2009/0161057 A1 | 6/2009 | Kim et al. | |
| 2010/0141622 A1 | 6/2010 | Kim et al. | |
| 2010/0283931 A1 * | 11/2010 | Horiuchi | G02F 1/1345 349/46 |

FOREIGN PATENT DOCUMENTS

| | | |
|---|---|---|
| JP | 2000338521 A | 12/2000 |
| JP | 2002040486 A | 2/2002 |
| JP | 2005527856 A | 9/2005 |
| JP | 2006039524 A | 2/2006 |
| JP | 2006259691 A | 9/2006 |
| JP | 2009020199 A | 1/2009 |
| JP | WO 2009128179 A1 * | 10/2009 ............ G02F 1/1345 |

OTHER PUBLICATIONS

Office Action for U.S. Appl. No. 13/138,396 mailed Nov. 15, 2013.
Notice of Allowance for U.S. Appl. No. 13/138,396 mailed Mar. 3, 2014.

* cited by examiner

TFT ARRAY SUBSTRATE, AND LIQUID CRYSTAL DISPLAY PANEL

This application is a divisional application of and claims priority under 35 U.S.C. §120/121 to U.S. application Ser. No. 13/138,396 filed Aug. 10, 2011, which is a national phase under U.S.C. §371 of PCT International Application No. PCT/JP2009/068905 which has an International filing date of Nov. 5, 2009, which designated the United States of America, and which claims priority to Japanese patent application number JP 2009-033132 filed Feb. 16, 2009, the entire contents of each of which are hereby incorporated herein by reference.

TECHNICAL FIELD

The present invention relates to a TFT array substrate in which TFT elements are provided on an insulating substrate, and to a liquid crystal display panel using the TFT array substrate.

BACKGROUND ART

TFT array substrates in which TFT (Thin Film transistor) elements are provided on an insulating substrate have been widely used in display devices (such as liquid crystal panels), and sensor devices. The TFT elements are connected with wirings at their electrodes.

Specifically, a TFT element is connected with a corresponding gate bus line at its gate electrode, and connected with a corresponding source bus line at its source electrode.

Moreover, in case where the TFT array substrate is used in a liquid crystal panel, the TFT element is connected with a pixel electrode at its drain electrode.

In case where the TFT elements are arrayed in matrix, the gate bus lines and the source bus lines are provided perpendicular to each other on the insulating substrate. In this case, the gate bus lines and source bus lines are provided in different layers on the insulating substrate between which an insulating layer is provided, lest the gate bus lines and source bus lines be electrically connected with each other.

(Schematic Configuration of TFT Array Substrate)

Next, a configuration of the TFT array substrate is schematically described below.

FIG. 12 is a plane view schematically illustrating a configuration of a TFT array substrate 20.

As illustrated in FIG. 12, the TFT array substrate 20 has a display area 22 in a central portion thereof in a plane view. In the display area, TFT elements and pixel electrodes correspondingly connected to the TFT elements are arrayed in matrix.

An area around the display area 22 and in the vicinity of substrate edges 26 of the TFT array substrate 20 is a periphery area 24. In the periphery area 24, a driver circuit 60 and the like are provided.

One specific example of the driver circuit 60 is a gate driver circuit. FIG. 12 illustrates an exemplary configuration in which the driver circuit 60 is provided in the periphery area 24 on either side of the display area 22 in a horizontal direction (the X direction in FIG. 12).

In this configuration, the driver 60 is connected with the TFT elements (not illustrated) in the display area 22 via wirings such as the gate bus lines 42.

Moreover, the TFT array substrate 20 illustrated in FIG. 12 is provided with a driver 62 in the periphery area 24 on one of both sides of the display area 22 in the vertical direction (the Y direction in FIG. 12). The driver 62 and the driving circuits 60 are connected via a gate driver circuit signal wiring 46 such as a clock wiring. Moreover, the driver 62 is connected with the TFT element (not illustrated) in the display area 22 via wirings such as the source bus lines 44.

Moreover, the TFT array substrate 20 are assembled together with a counter electrode (not illustrated) via a seal 90, thereby constituting a liquid crystal display panel 10. The seal 90 is provided in a frame-like shape along and inside the substrate edges 26 of the TFT array substrate 20.

(Periphery Area)

Next, based on FIG. 13, the periphery area 24 is described in more details.

FIG. 13 is a plane view schematically illustrating a configuration of the periphery area 24.

As illustrated in FIG. 13, the periphery area 24 is provided with not only the driver circuits 60 but also various wirings connected with the driver 62. The wirings are provided between the driver circuits 60 and substrate edges 26 of an insulating substrate 16. FIG. 13 illustrates an example of the TFT array substrate 20 in which a low-potential-side power supply wiring 70, a clock wiring 72, and branch wirings 74 are provided as the wirings. Among the wirings, the low-potential-side power supply wiring 70 and the clock wiring 72 are extended in the vertical direction (Y direction) and the branch wirings 74 are extended in the horizontal direction (X direction). Further, the low-potential-side power supply wiring 70 and the clock wiring 72 are electrically connected with the driver circuit 60 via the branch wirings 74, correspondingly.

(Metal Materials Etc.)

Next, metal materials etc. for forming the wirings are explained below.

The low-potential-side power supply wiring 70 and the clock wiring 72 extended in the Y direction are provided on the insulating substrate in such a manner that the low-potential-side power supply wiring 70 and the clock wiring 72 extended in the Y direction are provided in a layer different from another layer thereon in which the branch wirings 74 extended in the X direction are provided. And, they are formed from different metal materials.

FIG. 14 is a cross sectional view schematically illustrating a configuration of the TFT array substrate 20.

As illustrated in FIG. 14, it is generally configured such that a first metal material M1, a first insulating material 11, a second metal material M2, a second insulating material 12, and a third metal material M3 are laminated in this order on the insulating substrate 16. The first metal material M1 is a material from which the gate bus lines 42 are formed. The first insulating material 11 is a material from which a gate insulating film 50 is formed. The second metal material M2 is a material from which the source bus lines 44 are formed. The second insulating material 12 is a material from which an interlayer insulating film 52 is formed. And the third metal material M3 is a material from which pixel electrodes 48 are formed.

The low-potential-side power supply wiring 70 and the clock wiring 72 are formed from the first metal material M1, and the branch wirings 74 are formed from the second metal material M2.

With this configuration, a wiring extended in the X direction can be crossed easily with a wiring extended in the Y direction, without electrically connecting these wirings as illustrated in an intersection part 82 in FIG. 13.

On the other hand, it is necessary to provide a contact hole in order to establish electrical connection between a wiring extended in the X direction and a wiring extended in the Y direction, as illustrated at a connection portion 80 in FIG. 13.

(Patent Literature 1)

One conventional configuration of such a contact hole is one as illustrated in Patent Literature 1, for example.

FIG. 15 is a view illustrating an amorphous silicon thin film transistor liquid crystal display panel as described in Patent Literature 1.

As illustrated in FIG. 15, a main wiring 150 and a gate electrode 160 are connected electrically via a contact hole 100 provided in a connection portion 80.

CITATION LIST

Patent Literatures

[Patent Literature 1]
Japanese Translation of PCT Application, Tokuhyo, No. 2005-527856 A (Publication Date: Sep. 15, 2005)
[Patent Literature 2]
U.S. Pat. No. 7,379,148 B2, specification (May 27, 2008)
[Patent Literature 3]
Japanese Patent Application Publication, Tokukai, No. 2006-259691 (Publication Date: Sep. 28, 2006)
[Patent Literature 4]
Japanese Patent Application Publication, Tokukaihei, No. 9-179116 (Publication Date: Jul. 11, 1997)
[Patent Literature 5]
Japanese Patent Application Publication, Tokukai, No. 2006-39524 (Publication Date: Feb. 9, 2006)

SUMMARY OF INVENTION

Technical Problem

However, the conventional configuration of the contact hole 100 has such a problem that it causes deterioration in display quality of the liquid crystal display panel 100. The following explains the problem.

FIG. 16 is a view schematically illustrating a configuration of a conventional connection portion 80. Meanwhile, FIG. 17 is a cross sectional view taken across line C-C of FIG. 16.

As illustrated in FIG. 16, the conventional contact hole 100 is partly on and off the clock wiring 72 when viewed in a plane view. That is, the conventional contact hole 100 has an off-wiring portion 104.

As illustrated in FIG. 17, the contact hole 100 allows the clock wiring 72 to be connected with the branch wiring 74.

The clock wiring 72 is formed from the first metal material M1 from which the layer of the gate bus line 42 is formed. Meanwhile, the branch wiring 74 is formed from the second metal material M2 from which the layer of the source bus line 44 is formed. Therefore, the clock wiring 72 and the branch wiring 74 are formed on the different layers on the insulating substrate 16.

A connection conductor 102 provided in the contact hole 100 connects the clock wiring 72 with the branch wiring 74. However, the clock wiring 72 and the branch wiring 74 do not overlap each other in the plane view. Accordingly, the connection conductor 102 is so provided that it can connect the clock wiring 72 with the branch wiring 74 in the plane view.

(Via Hole)

More specifically, through a main-wiring via hole 110, the connection conductor 102 and the clock wiring 72 are connected with each other at a place where the connection conductor 102 and the clock wiring 72 overlap each other in a plane view. Meanwhile, through a branch-wiring via hole 112, the connection conductor 102 and the branch wiring 74 are connected with each other at a place where the connection conductor 102 and the branch wiring 74 overlap each other in a plane view.

In other words, the contact hole 100 is so configured that the clock wiring 72 and the branch wiring 74 are connected through the two via holes.

Here, the connection conductor 102 is formed from the third metal material M3, which is a material from which the pixel electrodes are formed.

In the vicinity of the main-wiring via hole 110, the gate insulating film 50 and the interlayer insulating film 52 intervene between the clock wiring 72 and the connection conductor 102. Accordingly, the main-wiring via hole 110 penetrates the gate insulating film 50 and the interlayer insulating film 52 so as to allow the clock wiring 72 and the connection conductor 102 to be connected with each other.

Similarly, in the vicinity of the branch-wiring via hole 112, the interlayer insulating film 52 intervenes between the branch wiring 74 and the connection conductor 102. Accordingly, the branch-wiring via hole 112 penetrates the interlayer insulating film 52 so as to allow the branch wiring 74 and the connection conductor 102 to be connected with each other.

(Off-Wiring Portion)

The main-wiring via hole 110 and the branch-wiring via hole 112 are connected via the connection conductor 102.

The conventional TFT array substrate 20 is so configured that the clock wiring 72 and the branch wiring 74 do not overlap each other in a plane view. That is, the branch wiring 74 is extended just short of clock wiring 72. Accordingly, the connection conductor 102 has an off-wiring portion 104. The off-wiring portion 104 is that portion of the connection conductor 102 which is off the clock wiring 72 in a plane view.

The off-wiring portion 104 allows the connection between the main-wiring via hole 110 and the branch-wiring via hole 112.

(Seal)

Next, the seal 90 for bonding the TFT array substrate 20 with the counter substrate.

The seal 90 is provided in the periphery area 24 of the TFT array substrate 20 so as to be along the substrate edges 26, as illustrated in FIG. 12. As illustrated in FIG. 16, the seal 90 covers the low-potential-side power supply wiring 70, the clock wiring 72, and, partly, the driver circuits 60. That is, in the plane view, the seal 90 overlaps the wiring extended in the X direction, and the wiring extended in the Y direction.

The seal 90 is so positioned for the sake of sufficiently functioning to bond the TFT array substrate 20 and the counter substrate 18, and reducing an area of the frame portion.

Because the seal 90 is so positioned, the contact hole 100 is positioned under the seal 90.

(Cell Thickness)

The conventional liquid crystal display panel 10 likely fails to keep a uniform cell thickness in the vicinity of the seal 90.

The failure of keeping uniform cell thickness is due to a level difference caused by the contact hole 100 and to differences in width, density, etc. of the wirings provided under the seal 90.

Especially, the conventional liquid crystal display panel 10 in which the connection conductor 102 has the off-wiring portion is apt to have such an uneven cell thickness.

(Seal Thickness)

The uneven cell thickness is caused because there are regions with or without the contact hole 100 when viewed along the Y direction. That is, the uneven cell thickness is caused because the seal 90 has an uneven thickness between the two kind regions. In addition to two dent parts due to the main-wiring via hole 110 and the branch-wiring via hole 112, there is a dent portion formed along the Y direction at or near the contact hole 100. The dent portion formed along the Y direction at or near the contact hole 100 likely causes the uneven cell thickness.

As described above, the conventional liquid crystal display panel 10 likely has an uneven cell thickness due to pattern configuration at or near the contact hole 100 or uneven wiring density at or near the contact hole 100.

(Display Quality)

The uneven cell thickness likely deteriorates a display quality.

Moreover, the conventional liquid crystal display panel 10 with the off-wiring portion has such a problem in that the off-wiring portion makes it difficult to perform uniform light irradiation to a light curing resin or the like in case where the light curing resin or the like is provided at or near the contact hole 100. This leads to insufficient curing of the light curing resin. In such a case, a material of the sealing 90 would likely seep in a liquid crystal layer, thereby causing poor display quality.

(Output Characteristics of Driver Circuit)

Further, in response to recent demands for outer dimensional reduction of display panels, the periphery area 24 of the TFT array substrate 20 may be reduced in area, as a result of which inter-wiring distances between wirings such as the low-potential-side power supply wiring 70 and clock wiring 72 should be smaller. In this case, the configuration with the off-wiring portion may be a hindrance to the reduction in the inter-wiring distances. That is, the reduction in the inter-wiring distances cannot be done in such a way that an area in which the off-wiring portion overlaps an adjacent wiring is reduced or a distance from the off-wiring portion to such an adjacent wiring is reduced, because, if the off-wiring portion is so arranged, wiring load will be increased, thereby deteriorating the output characteristics of the driver circuits.

The present invention was accomplished in order to solve the problems, and an object thereof is to provide a TFT array substrate and a liquid crystal display panel, each of which can avoid display quality deterioration caused by an uneven cell thickness.

Solution to Problem

In order to attain the object, a TFT array substrate according to the present invention is a TFT array substrate, in which TFT elements and pixel electrodes being correspondingly connected with the TFT elements are arrayed in matrix on an insulating substrate, the TFT array substrate including: gate bus lines on the insulating substrate, the gate bus lines being correspondingly connected with the TFT elements and being formed from a first metal material; and source bus lines on the insulating substrate, the source bus lines being correspondingly connected with the TFT elements and being formed from a second metal material, the pixel electrodes being made from a third metal material, the insulating substrate having a display area in which the pixel electrodes are arrayed in matrix, and a periphery area around the display area, the periphery area being provided with driver circuits for driving the TFT elements corresponding thereto, the periphery area being provided with (i) branch wirings being correspondingly connected with the driver circuits, and (ii) a main wring being connected with the branch wirings, the branch wirings being formed from one of the first metal material and the second metal material, the main wiring being formed from the other one of the first metal material and the second metal material, the periphery area being provided with connection parts, at which the main wiring is connected with the respective branch wirings, at each of the connection parts, a connection conductor electrically connecting the main wiring with corresponding one of the branch wirings, the connection conductor being formed from the third metal material, the connection parts each having a branch-wiring via hole through which the corresponding one of the branch wirings, which is covered with the connection conductor, is exposed, at least one of the connection parts being such that at least part of the branch-wiring via hole overlaps with the main wiring in a plane view.

Moreover, in order to attain the object, a TFT array substrate according to the present invention is a TFT array substrate in which TFT elements and pixel electrodes being correspondingly connected with the TFT elements are arrayed in matrix on an insulating substrate, the TFT array substrate including: gate bus lines on the insulating substrate, the gate bus lines being correspondingly connected with the TFT elements and being formed from a first metal material; and source bus lines on the insulating substrate, the source bus lines being correspondingly connected with the TFT elements and being formed from a second metal material, the pixel electrodes being made from a third metal material, the insulating substrate having a display area in which the pixel electrodes are arrayed in matrix, and a periphery area around the display area, the periphery area being provided with periphery TFT elements for driving the TFT elements corresponding thereto, the periphery area being provided with (i) branch wirings being correspondingly connected with the periphery TFT elements, and (ii) a main wring being connected with the branch wirings, the branch wirings being formed from one of the first metal material and the second metal material, the main wiring being formed from the other one of the first metal material and the second metal material, the periphery area being provided with connection parts, at which the main wiring is connected with the respective branch wirings, at each of the connection parts, a connection conductor electrically connecting the main wiring with corresponding one of the branch wirings, the connection conductor being formed from the third metal material, the connection parts each having a branch-wiring via hole through which the corresponding one of the branch wirings is exposed, provided that the connection conductor covers this exposed portion of the corresponding one of the branch wirings, at least one of the connection parts being such that at least part of the branch-wiring via hole overlaps with the main wiring in a plane view.

In these configurations, in the connection parts, at least part of the branch-wiring via hole overlaps with the main wiring in a plane view. These configurations makes it difficult for the connection conductor to have a off-wiring portion described above, thereby causing the wiring layer to have more uniform thickness in the direction in which the main wirings extend.

This makes it easy to prevent the uneven cell thickness, for example, in case where the seal is provided in the periphery area. Thus, it becomes easier to prevent display quality deterioration in the TFT array substrate with any of these configurations.

Advantageous Effects of Invention

As described above, the TFT array substrate according to the present invention is configured to include: gate bus lines on the insulating substrate, the gate bus lines being correspondingly connected with the TFT elements and being formed from a first metal material; and source bus lines on the insulating substrate, the source bus lines being correspondingly connected with the TFT elements and being formed from a second metal material, the pixel electrodes being made from a third metal material, the insulating substrate having a display area in which the pixel electrodes are arrayed in matrix, and a periphery area around the display area, the periphery area being provided with driver circuits or periphery TFT elements for driving the TFT elements corresponding thereto, the periphery area being provided with (i) branch wirings being correspondingly connected with the driver circuits or periphery TFT elements, and (ii) a main wring being connected with the branch wirings, the branch wirings being formed from one of the first metal material and the second metal material, the main wiring being formed from the other one of the first metal material and the second metal material, the periphery area being provided with connection parts, at which the main wiring is connected with the respective branch wirings, at each of the connection parts, a connection conductor connecting the main wiring with corresponding one of the branch wirings, the connection conductor being formed from the third metal material, the connection parts each having a branch-wiring via hole through which the corresponding one of the branch wirings, which is covered with the connection conductor, is exposed, at least one of the connection parts being such that at least part of the branch-wiring via hole overlaps with the main wiring in a plane view.

This makes it possible to prevent display quality deterioration caused by uneven cell thickness.

DESCRIPTION OF EMBODIMENTS

In the followings, embodiments of the present invention are described in more details.

Embodiment 1

One embodiment of the present invention is described below referring to FIGS. 1 and 2.

Figure 1:
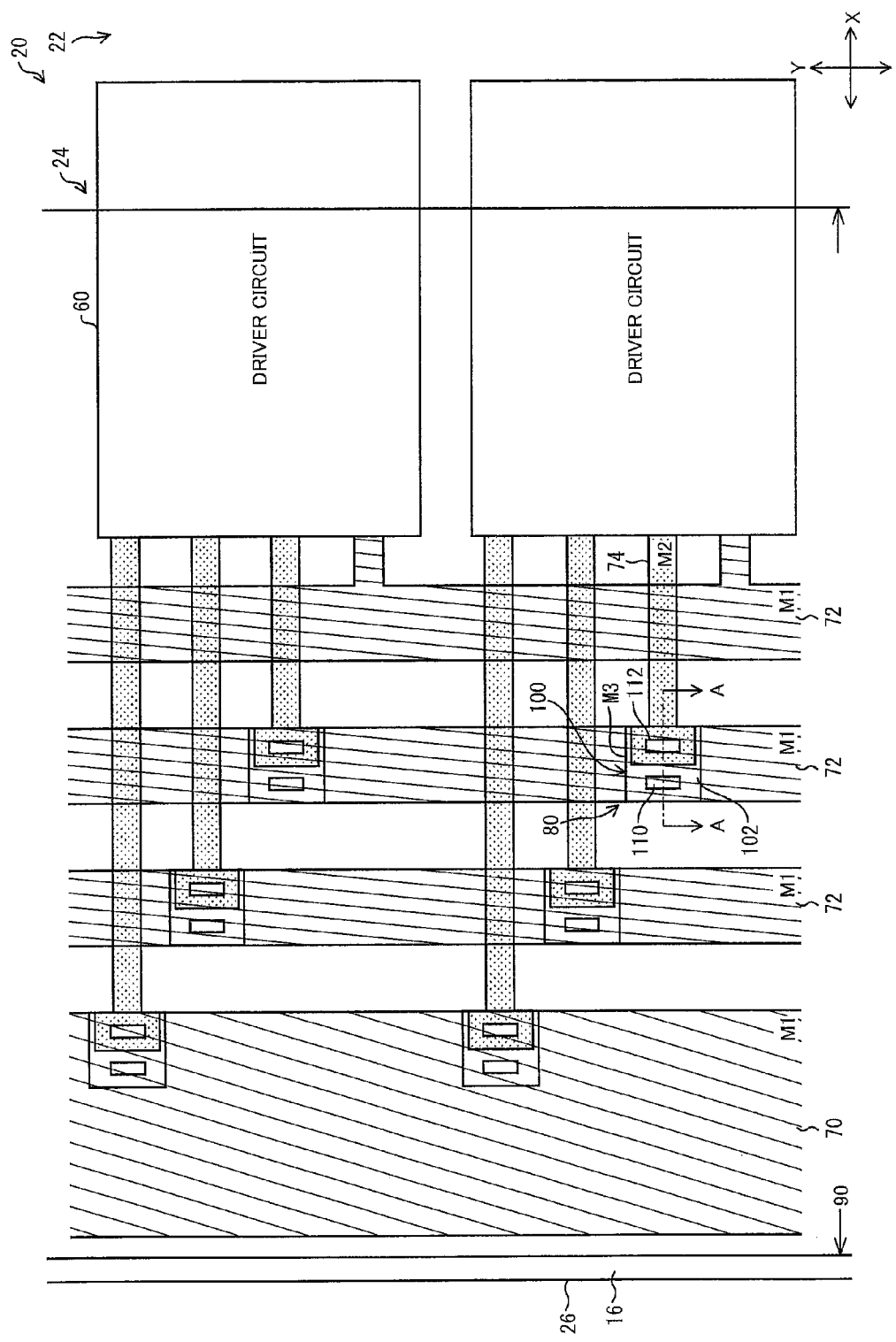
FIG. 1 is a view schematically illustrating a configuration of a TFT array substrate according to one embodiment of the present invention.

FIG. 1 is a view schematically illustrating a configuration of a TFT array substrate 20 of the present embodiment.

The schematic configuration of the TFT array substrate 20 of the present embodiment is substantially similar to that of the TFT array substrate 20 explained above referring to FIG. 16.

That is, various wirings (wiring layer) and driver circuits are provided in a periphery area 24 of the TFT array substrate 20.

More specifically, the various wirings encompass a low-potential-side power supply wiring 70 (signal wiring for scanning line driver circuits) and clock wirings 72 (signal wiring for scanning line driver circuits) along the Y direction of the TFT array substrate 20. The low-potential-side power supply wiring 70 and clock wirings 72 are each main wirings. More specifically, one low-potential-side power supply wiring 70, and three clock wirings 72 are aligned in this order in a direction of from one substrate edge 26 to a display area 22.

Moreover, driver circuits 60 (such as gate driver circuits) are provided between these wirings and the display area 22.

Here, the display area 22 is an area in which TFT elements (not illustrated) and pixel electrodes (not illustrated) connected correspondingly with the TFT elements are arrayed in matrix.

Further, branch wirings 74 are provided for connecting these wirings correspondingly with the driver circuits 60. The branch wirings 74 are extended in the X direction.

A contact hole 100 is provided at each of intersection parts 80 at which the branch wirings 74 are connected with the low-potential-side power supply wiring 70 or any of the clock wirings 72 correspondingly.

The TFT array substrate 20 according to the present embodiment is so configured that a connection conductor 102 has no off-wiring portion 104 described above. In the following, the configuration of the present embodiment is described referring to a connection portion 80 for connection between a clock wiring 72 and a branch wiring 74, for example.

At the connection portion 80, the clock wiring 72 and the branch wiring 74 are electrically connected with each other through a contact hole 100.

Figure 2:
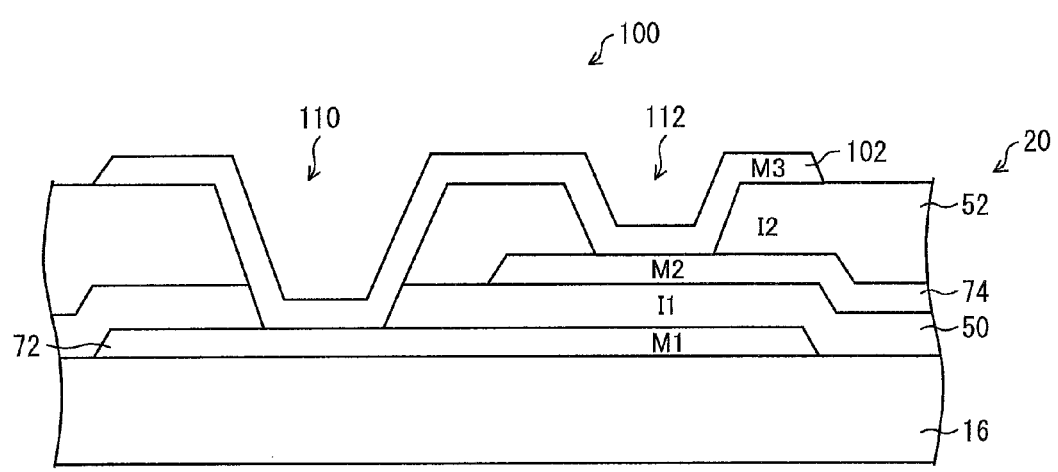
FIG. 2 is a view illustrating a cross section taken along line A-A of FIG. 1.

Referring to FIG. 2, this configuration is described in further details. FIG. 2 is a cross sectional view taken along line A-A of FIG. 1.

As illustrated in FIG. 2, the contact hole 100 has two via holes, namely, a main-wiring via hole 110 and a branch-wiring via hole 112. Through the main-wiring via hole 110, the connection conductor 102 and the clock wiring 72 are connected with each other. In other words, through the main-wiring via hole 110, the clock wiring 72 (serving as a main wiring) which is covered with the connection conductor 102, is exposed.

Moreover, through the branch-wiring via hole 112, the connection conductor 102 and the branch wiring 74 are connected with each other. In other words, through the branch-wiring via hole 112, the branch wiring 74 is exposed, provided that the connection conductor 102 covers this exposed portion of the branch wiring 74.

The clock wiring 72 is formed from a first metal material M1 from which gate bus lines 42 are formed. Meanwhile, the branch wiring 74 is formed from a second metal material M2 from which source bus lines 44 are formed. Moreover, the connection conductor 102 is formed from a third metal material M3 from which the pixel electrodes 48 are formed.

These metal materials are laminated on an insulting substrate 16 made of glass in an order of the first metal material M1, the second metal material M2, and the third metal material M3. Between the first metal material M1 and the second metal material M2, a gate insulating film 50 is provided. The gate insulating film 50 is formed from a first insulating material 11. Moreover, between the second metal material M2 and the third metal material M3, an interlayer insulating film 52 is provided. The interlayer insulating film 52 is formed from a second insulating material 12. Moreover, the first metal material M1 and the second metal material M2 may be, but not limited to, aluminum, molybdenum, tantalum, or the like. Moreover, the third metal material M3 may be, for example, ITO (Indium Tin Oxide) or the like.

With this configuration, at the main-wiring via hole 110, the connection conductor 102 penetrates the gate insulating film 50 and the interlayer insulating film 52 and is connected with the clock wiring 72.

Moreover, at the branch-wiring via hole 112, the connection conductor 102 penetrates the interlayer insulating film 52 and is connected with the branch wiring 74.

Moreover, the TFT array substrate 20 of the present embodiment is so configured that, at the connection portion 80, the clock wiring 72 and branch wiring 74 overlap each other in a plane view.

Therefore, the connection conductor 102 has no portion under which neither the clock wiring 72 nor the branch wiring 74 is provided. In other words, either the clock wiring 72 or the branch wiring 74 are provided under the connection conductor 102 with no exception. What is meant by the wording "under" the connection conductor 102 or the portion thereof is under these but above the insulating substrate 16.

In the configuration explained above, the connection conductor 102 has no off-wiring portion in which, in a plane view, the connection conductor 102 does not overlap any of the wirings to which the connection conductor 102 is connected. In other words, in the connection portion 80, the connection conductor 102 is provided only on the wirings to which the connection conductor 102 is connected.

More specifically, the TFT array substrate 20 exemplified in the present embodiment is so configured that the connection conductor 102 overlaps the clock wiring 72 in a plane view in such a way that both sides of the connection conductor 102 are matched with sides of the clock wiring 72. Therefore, the connection conductor 102 has no portion that is off the clock wiring 72 in a plane view.

As described above, the connection conductor 102 of the present embodiment overlaps the clock wiring 72 in a plane view in such a way that both sides of the connection conductor 102 are matched with sides of the clock wiring 72, wherein the clock wiring 72 is a wiring undermost between two wirings to which the connection conductor 102 is connected, in other words a wiring that is closer to the insulting substrate 16 between the two wirings to which the connection conductor 102 is connected.

Figure 16:
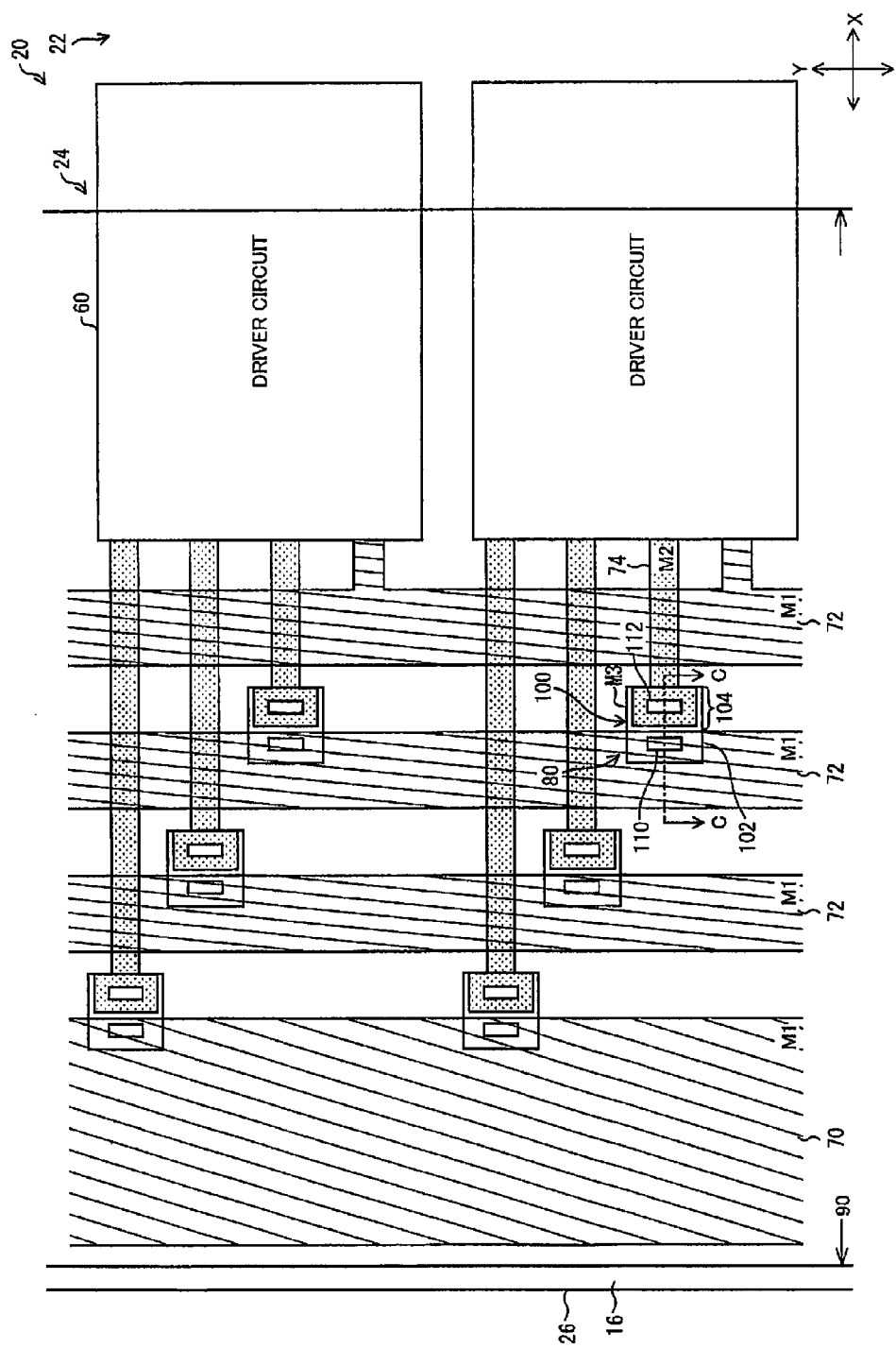
FIG. 16 is a view illustrating a conventional art and schematically illustrating a configuration of a connection portion.
Figure 17:
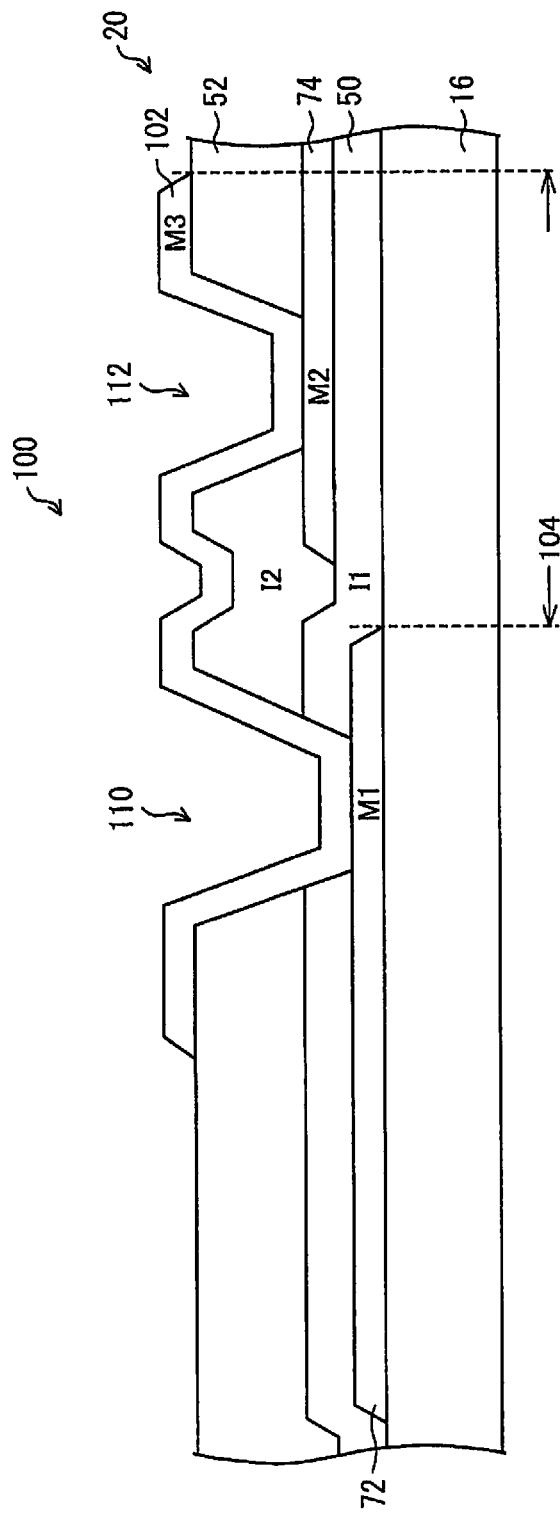
FIG. 17 is a cross sectional view taken along line C-C of FIG. 16.

On the other hand, the branch wiring 74 connected with the clock wiring 72 is extended to overlap the clock wiring 72 in a plane view, unlike the conventional TFT array substrate 20 illustrated in FIG. 16.

With this configuration, the main-wiring via hole 110 and the branch-wiring via hole 112 can be provided above the clock wiring 72 in a plane view, as illustrated in FIG. 2. Further, with this configuration, the connection conductor 102 for covering and connecting the main-wiring via hole 110 and the branch-wiring via hole 112 can be provided without being off the clock wiring 72 in a plane view.

(Display Quality)

As described above, the connection conductor 102 is provided without being off the clock wiring 72 in a plane view, thereby making it possible to inhibit uneven cell thickness.

More specifically, the connection conductor 102 can easily attain a stable surface configuration, because the connection conductor 102 is provided over a uniform conductive layer.

In the present embodiment, the conductive layer under the whole connection conductor 102 is the clock wiring 72 provided on the insulating substrate 16. Because of this, the connection conductor 102 can easily attain a stable surface configuration.

Moreover, the connection conductor 102 has no off-wiring portion 104. Therefore, it becomes easier to have a more uniform wiring density under the seal 90 even if a contact hole is provided on a signal wiring for a scanning line driver circuit.

As a result, it becomes easy to attain uniform cell thickness in the TFT array substrate 20 of the present embodiment.

Moreover, because uneven cell thickness is thus inhibited, deterioration in display quality is inhibited in the TFT array substrate 20 of the present embodiment.

This effect of inhibiting the display quality deterioration caused due to the unevenness in the wirings or the like under the seal 90 is especially effective to a configuration in which the interlayer insulating film 52 is not a flattening film such as an organic film.

(Seal Curing)

Moreover, the TFT array substrate 20 according to the present embodiment makes it easier to cure the seal 90 surely.

Figure 12:
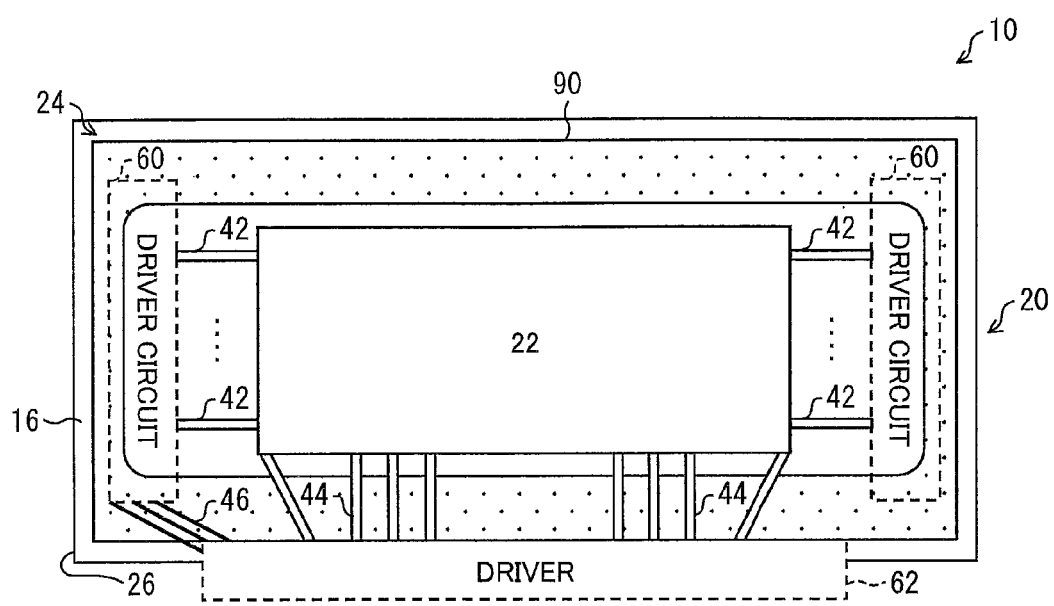
FIG. 12 is a plane view schematically illustrating a configuration of a TFT array substrate.
Figure 12:
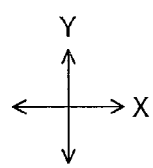
Figure 13:
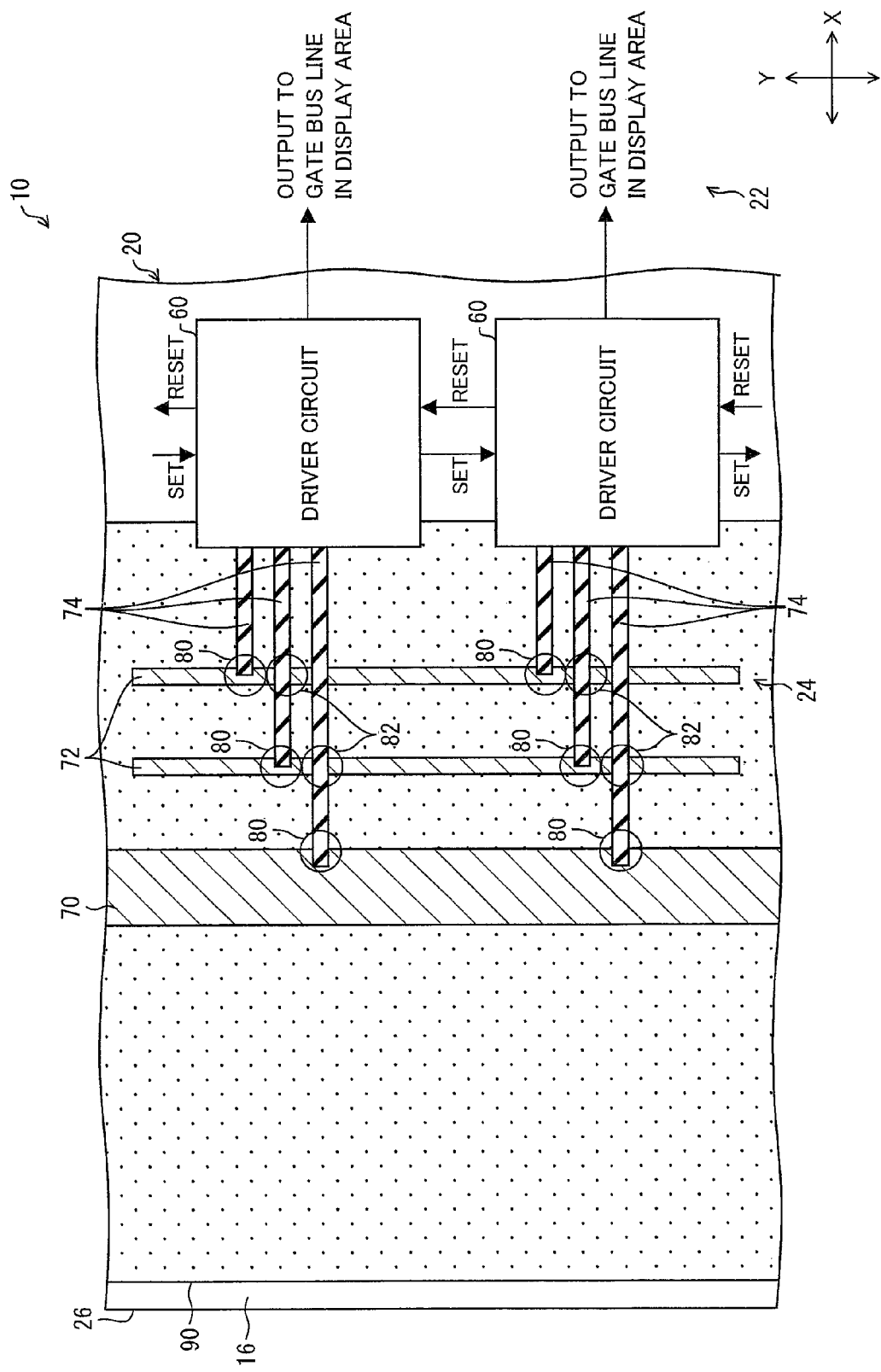
FIG. 13 is a plane view schematically illustrating a configuration of a periphery area of the TFT array substrate.
Figure 14:
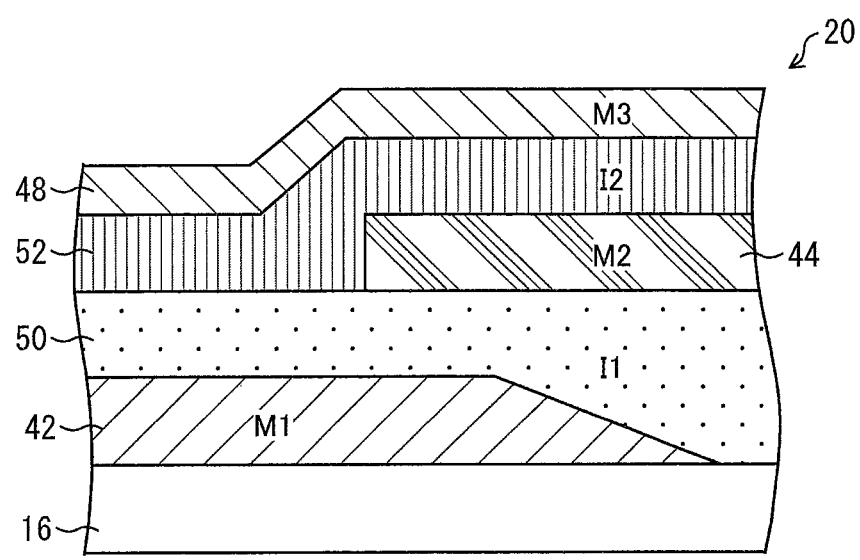
FIG. 14 is a cross sectional view schematically illustrating a configuration of the TFT array substrate.
Figure 15:
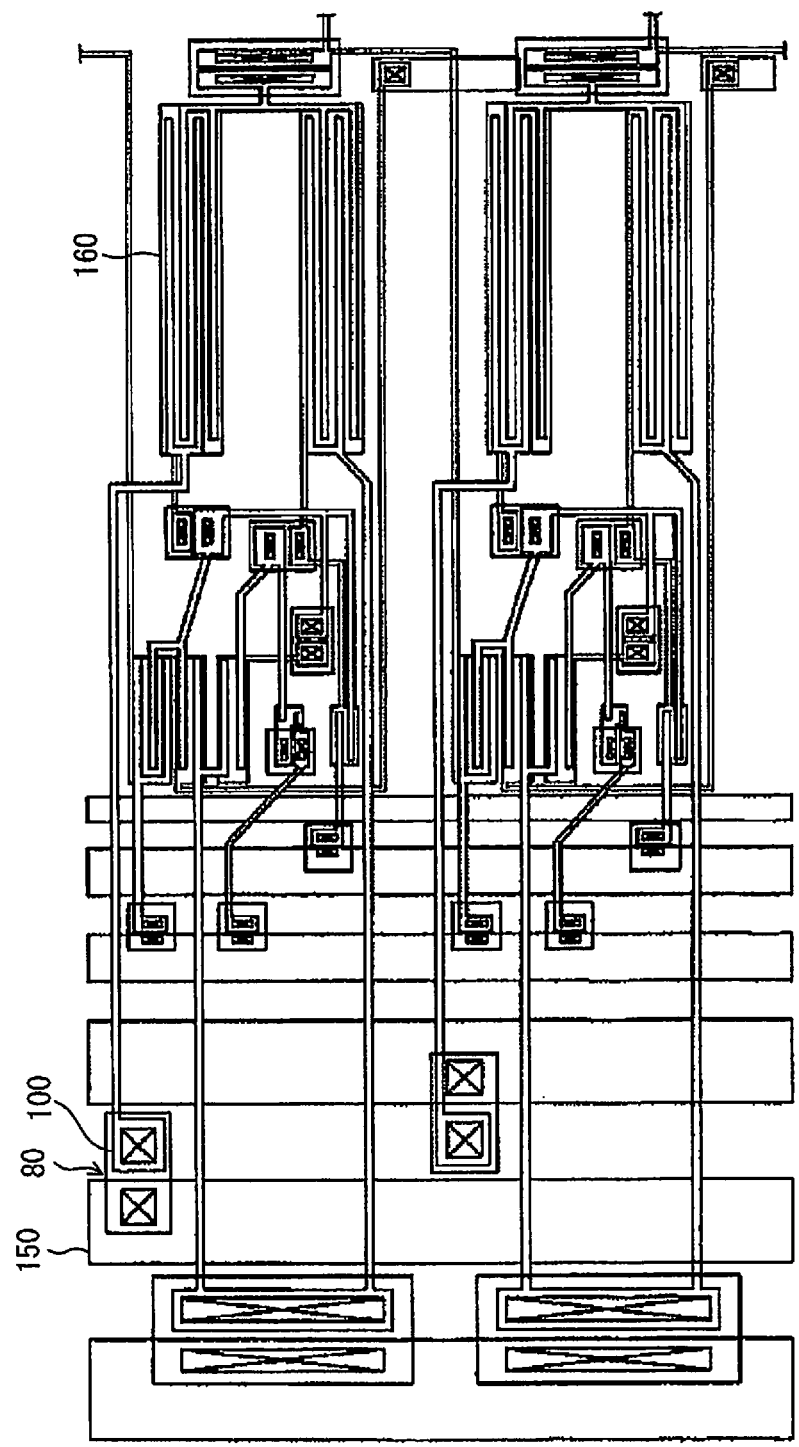
FIG. 15 is a view illustrating an amorphous silicon thin film transistor liquid crystal display panel as described in Patent Literature 1.

As described above referring to FIG. 12 and the like, the seal 90 for bonding the TFT array substrate 20 and the counter substrate (not illustrated) is provided in the periphery area 24 of the TFT array substrate 20. As a result, the contact holes 100 and their vicinities are covered with the seal 90.

In many cases, the seal 90 is UV-light curable. Further, in such a case, the seal 90 is irradiated with UV light from below the insulating substrate 16. Herein, the wording "from below the insulating substrate 16" means "from that side of the insulating substrate 16 on which the clock wiring 72 is not provided".

Further, the clock wiring 72, the branch wiring 74, etc. are not UV permeable in general, because these wirings, etc. are formed from a conductor(s), that is, metal.

Therefore, it is preferable that the peripheral area 24 in which the seal 90 is provided does not have too much wirings etc. therein. And if the peripheral area 24 has wirings etc. therein, it is preferable that the wirings has uniform density over the peripheral area 24.

In this regard, the TFT array substrate 20 according to the present embodiment is so configured that the connection conductor 102 has no off-wiring portion 104. More specifically, the connection conductor 102 has no portion that is off the clock wiring 72 in a plane view.

Consequently, the periphery area 24 has a smaller portion that is provided with the metal.

Accordingly, it becomes easier to attain more even density in the portion that is provided with the metal. This is attributed to the absence of the off-wiring portion 104 that is a metal protrusion.

With these reasons, the TFT array substrate 20 according to the present embodiment makes it easy to evenly irradiate light to the seal 90. As a result, the curing of the seal 90 can be surely performed.

This ensured effect of the seal 90 is particularly effective in a liquid crystal display panel which is manufactured by One-Drop-Fill method for introducing liquid crystal.

(Narrower Frame)

Moreover, with this configuration in which the connect conductor 102 has no off-wiring portion 104, it is possible to reduce the area occupied by the contact hole 100. Therefore, a wiring area can be smaller, thereby allowing the frame portion of the liquid crystal display panel to be narrower.

It should be noted that the present invention is not limited to the wiring width exemplified in FIG. 1 in which the clock wirings 72 are identical in wiring width.

Moreover, it is preferable that the peripheral area 24 has substantially same wiring density at edges (gate edges) in the X direction in FIG. 1 and at edges (source edges) in the Y direction in FIG. 1. Here, the wiring density=wiring width/space.

Moreover, the clock wirings 72 and the low-potential-side power supply wiring 70 (outer wiring) may or may not be formed from an identical metal material. For example, the low-potential-side power supply wiring 70 may be formed from the second metal material. In such a configuration, the low-potential-side power supply wiring 70 and the branch wiring 74 can be electrically connected without using the contact hole 100.

Moreover, the present invention is not limited as to how many the low-potential-side power supply wiring 70 is provided, while the present embodiment exemplifies a configuration in which the single low-potential-side power supply wiring 70 is provided. That is, a plurality of low-potential-side power supply wirings 70 may be provided.

Embodiment 2

Figure 3:
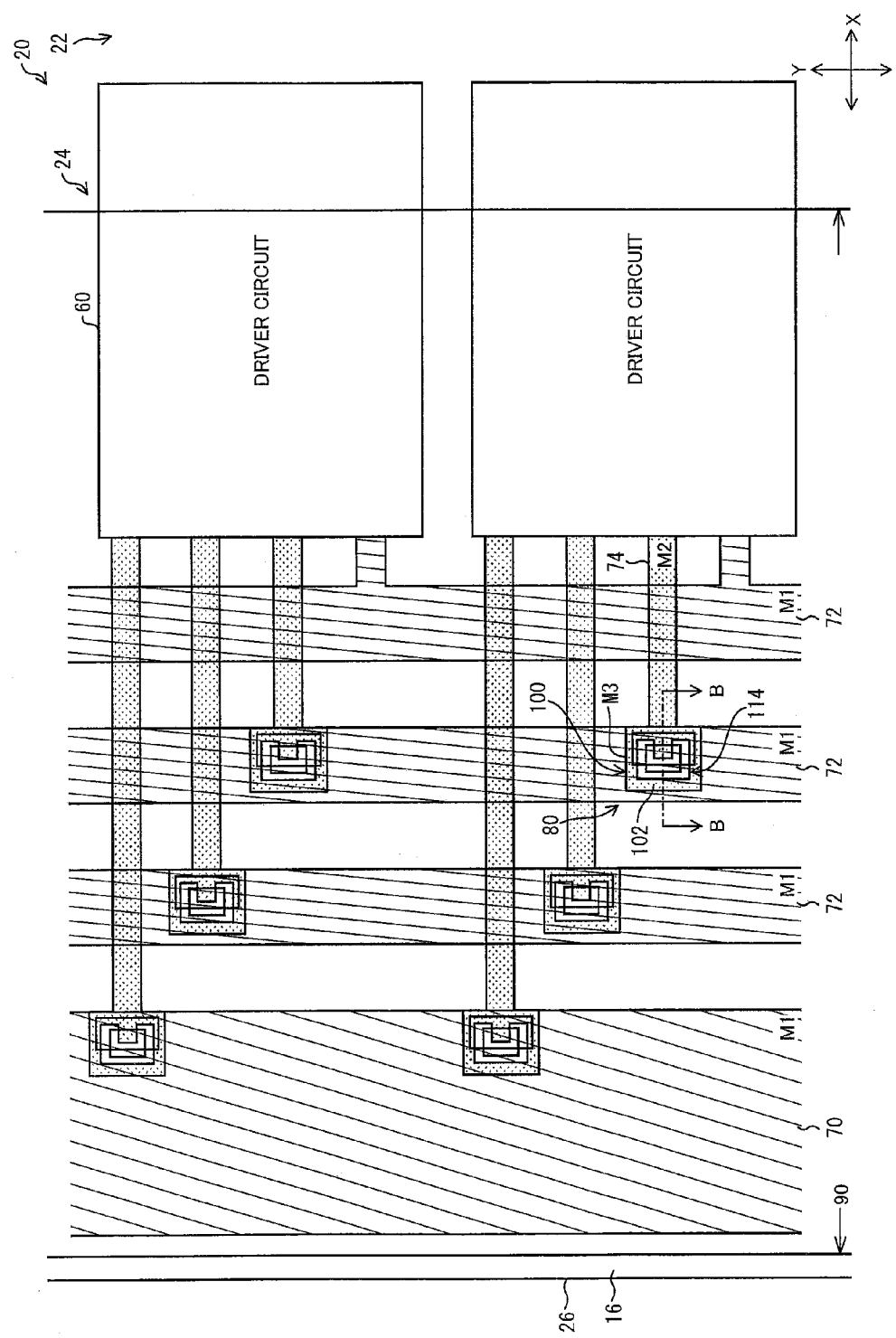
FIG. 3 is a view schematically illustrating a configuration of a TFT array substrate according to another embodiment of the present invention.
Figure 4:
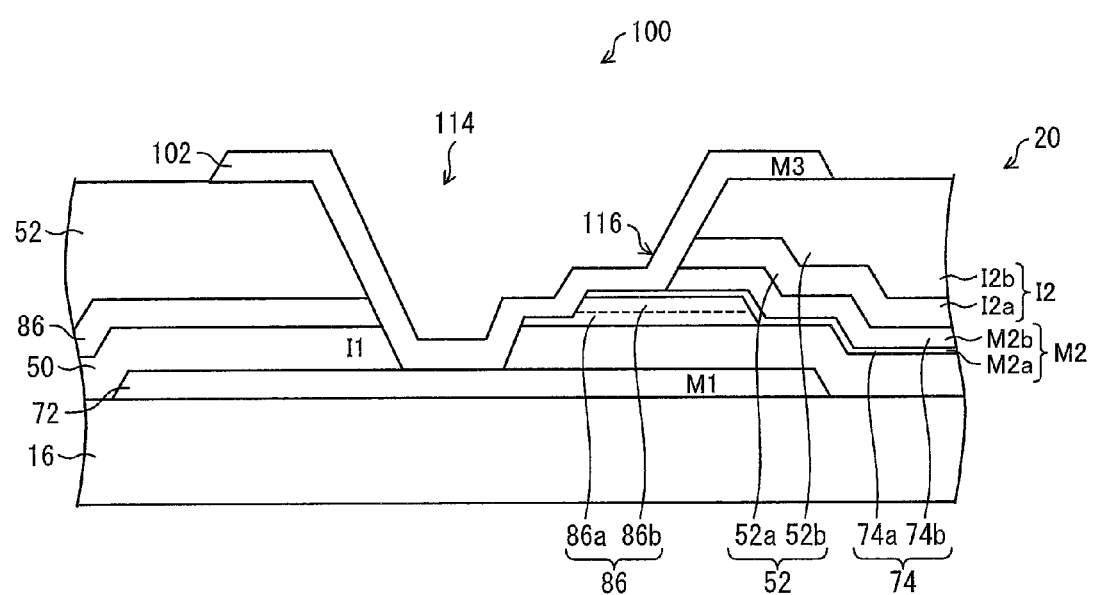
FIG. 4 is a view illustrating a cross section taken along line B-B of FIG. 3.

Another embodiment of the present embodiment is described below, referring to FIGS. 3 and 4. FIG. 3 is a view schematically illustrating a configuration of a TFT array substrate 20 according to the present embodiment. Moreover, FIG. 4 is a cross-sectional view taken along line B-B of FIG. 3.

For the sake of easy explanation, like reference numbers are given to members having the like functions similar to those explained in Embodiment 1, and their explanation is not repeated here.

The TFT array substrate 20 of the present embodiment is different from the TFT array substrate 20 of Embodiment 1 in terms of the configuration of the contact hole 100.

More specifically, the contact hole 100 of the present embodiment is different from that of Embodiment 1 in terms of how many via holes are provided in one contact hole 100.

That is, the contact hole 100 of Embodiment 1 has two via holes: the main-wiring via hole 110 and the branch-wiring via hole 112.

On the other hand, the contact hole 100 of the present embodiment has only one via hole, namely, a single via hole 114 serving as the branch via hole 112. In the following, this configuration is described in more details.

As illustrated in FIG. 4, the contact hole 100 of the present embodiment is also configured such that a branch wiring 74 overlaps a clock wiring 72 in a plane view. Further, a connection conductor 102 overlaps the clock wiring 72 in a plane view. Moreover, the connection conductor 102 has no off-wiring portion 104 that is off the clock wiring 72.

Unlike the contact hole 100 in Embodiment 1, the contact hole 100 of the present embodiment is configured such that the branch wiring 74 is provided in the vicinity of a via hole through which the connection conductor 102 is connected with the clock wiring 72.

Further, the branch wiring 74 is electrically connected with a side wall 116 of the via hole through which the connection conductor 102 and the clock wiring 72 are connected with each other.

With this configuration, the contact hole 100 of the present embodiment has only one via hole, namely, the single via hole 114, for the connection between the clock wiring 72 and the branch wiring 74.

Moreover, the TFT array substrate 20 of the present embodiment is provided with a semiconductor layer 86. The semiconductor layer 86 is provided between a gate insulating film 50 and a branch wiring 74. More specifically, the semiconductor layer 86 includes a lower semiconductor layer 86a provided on the gate insulating film 50, and an upper semiconductor layer 86b provided on the lower semiconductor layer 86a.

The lower semiconductor layer 86a is a general semiconductor layer. Moreover, the upper semiconductor layer 86b is an ohmic contact layer.

The TFT array substrate 20 of the present embodiment is provided with the semiconductor layer 86, thereby having a taper portion of the ohmic contact layer. The taper portion of the ohmic contact layer can prevent the connection conductor from being disconnected due to unevenness.

Moreover, the TFT array substrate 20 of the present embodiment is so configured that the branch wiring 74 includes two metal layers. More specifically, the branch wiring 74 includes a lower branch wiring 74a and an upper branch wiring 74b, wherein the insulating substrate 16 is closer to the lower branch wiring 74a than to the upper branch wiring 74b. The lower branch wiring 74a is formed from titanium (Ti), which is a metal material M2a. Meanwhile, the lower branch wiring 74b is formed from aluminum (Al), which is a metal material M2b.

(Modification)

Figure 5:
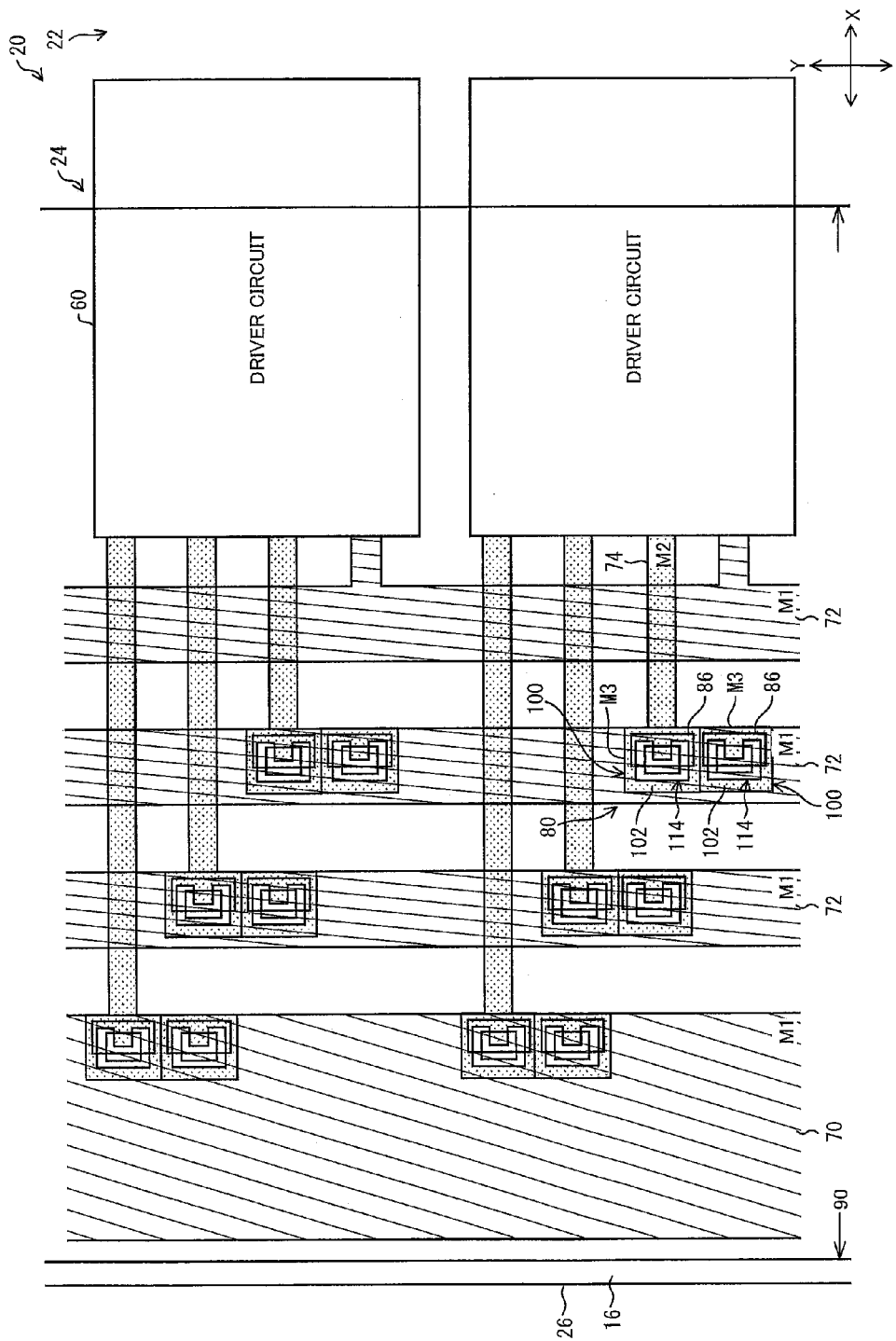
FIG. 5 is a view schematically illustrating a configuration of a TFT array substrate according to still another embodiment of the present invention.

Referring to FIG. 5, a modification of the TFT array substrate 20 of the present embodiment is described below. FIG. 5 is a view schematically illustrating a configuration of a TFT array substrate 20 according to the modification of the present embodiment.

The TFT array substrate 20 of the modification illustrated in FIG. 5 has two contact holes 100 for one connection portion 80.

More specifically, the two contact holes 100 along the Y direction in which the clock wiring 72 is extended. A connection conductor 102 in one of the two contact holes 100 is connected with that in the other one of the two contact holes 100.

Like the TFT array substrate 20 described above, the connection conductor 102 also overlaps the clock wiring 72 and has no off-wiring portion that is off the clock wiring 72.

How many contact holes 100 is provided per one connection portion 80 is not limited to two, and may be three or more.

In the TFT array substrate 20 according to this modification, a plurality of contact holes 100 is provided per one connection portion 80. Thereby, it becomes possible to reduce contact resistance.

Embodiment 3

Figure 6:
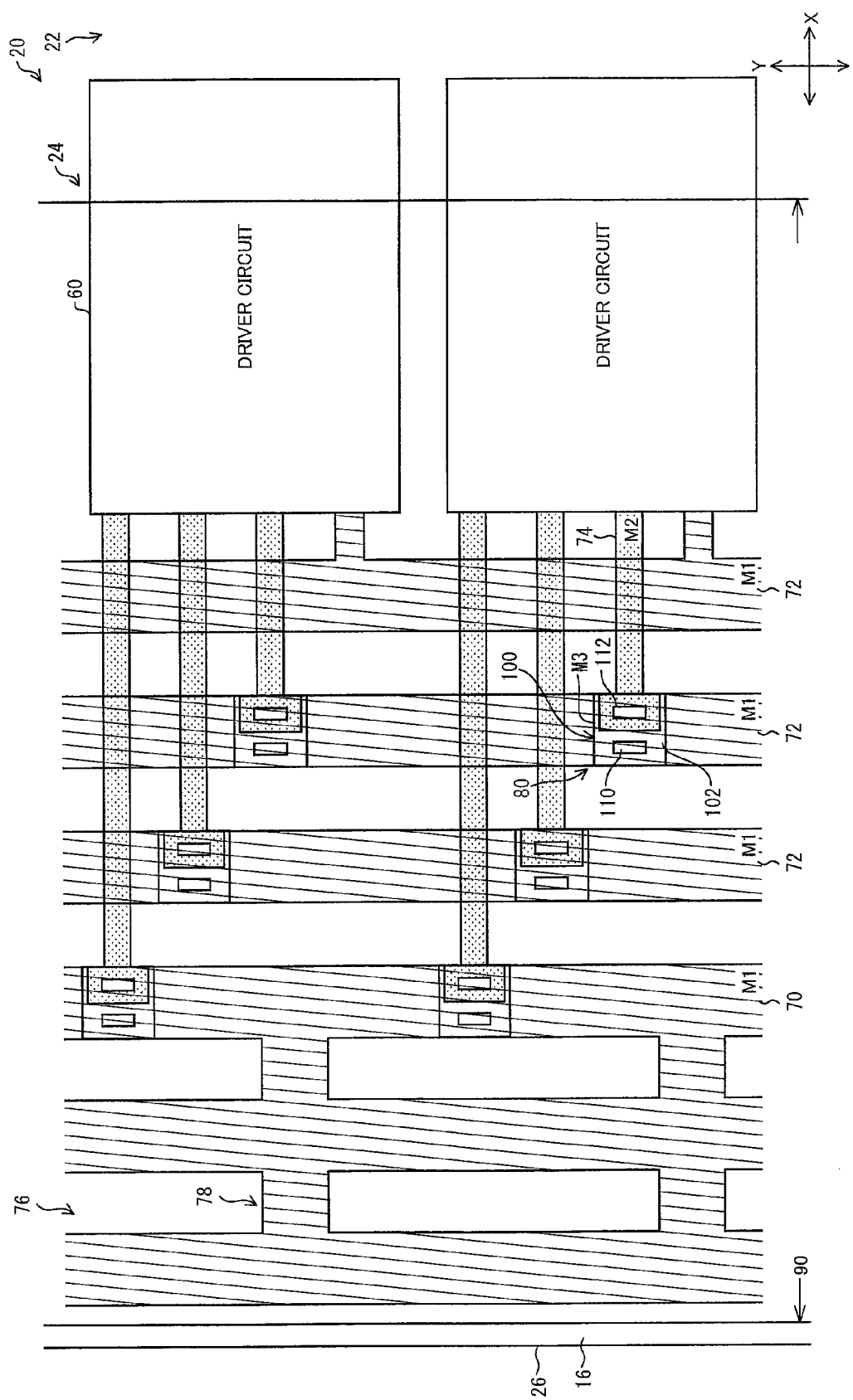
FIG. 6 is a view schematically illustrating a configuration of a TFT array substrate according to yet another embodiment of the present invention.
Figure 7:
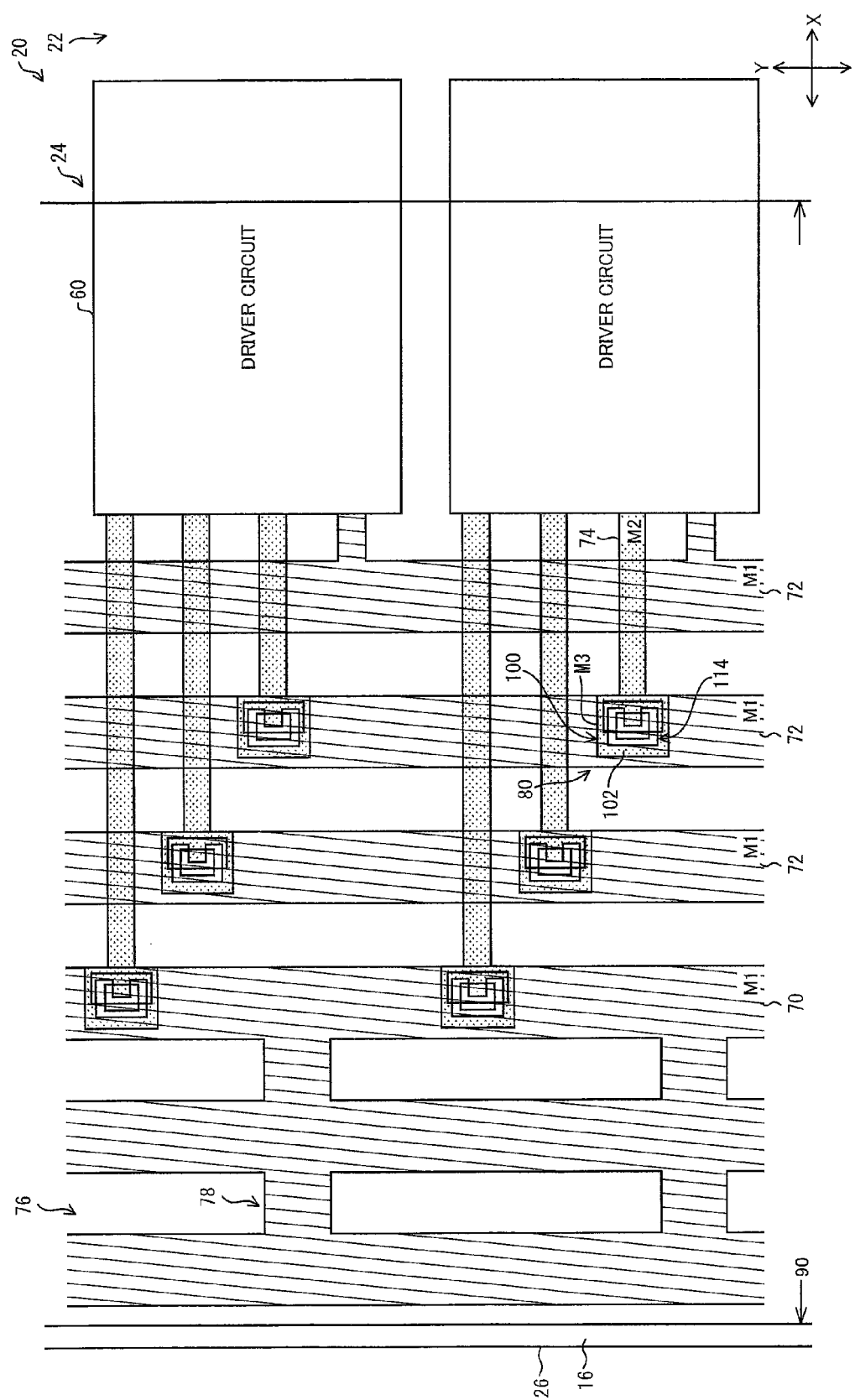
FIG. 7 is a view schematically illustrating a configuration of a TFT array substrate according to yet another embodiment of the present invention.

In the following, yet another embodiment of the present invention is described referring to FIGS. 6 and 7. FIGS. 6 and 7 are views schematically illustrating a configuration of a TFT array substrate 20 according to the present embodiment.

For the sake of easy explanation, like reference numbers are given to members having the like functions similar to those explained in each of the aforementioned embodiments, and their explanation is not repeated here.

The TFT array substrate 20 of the present embodiment is different from each TFT array substrate 20 of the aforementioned embodiments in terms of a wiring shape. More specifically, a wiring extended in the Y direction has a ladder-like shape.

In examples respectively illustrated in FIGS. 6 and 7, a low-potential-side power supply wiring 70, provided in an outer location toward a substrate edge 26 has a ladder-like shape.

More specifically, the low-potential-side power supply wiring 70 has rectangular void parts 76. In the examples illustrated in FIGS. 6 and 7, the void parts 76 are provided in two rows along the Y directions.

Each portion between the void parts 76 adjacent in the Y direction is a joint portion 78. The joint parts 78 correspond to "footsteps" of the ladder.

The examples illustrated in FIGS. 6 and 7 exemplify configurations in which two ladders are aligned in the X direction. However, the present invention is not limited to the number of "ladders" aligned in the X direction, and the number of ladders aligned in the X direction may be just one or may be three or more.

As described above, the TFT array substrate 20 of the present embodiment is so configured that a wiring has the void parts 76.

UV light passes through the void parts 76. Consequently, the area permissive to UV light is increased, thereby ensuring the curing of the seal 90 as explained above.

Embodiment 4

Figure 8:
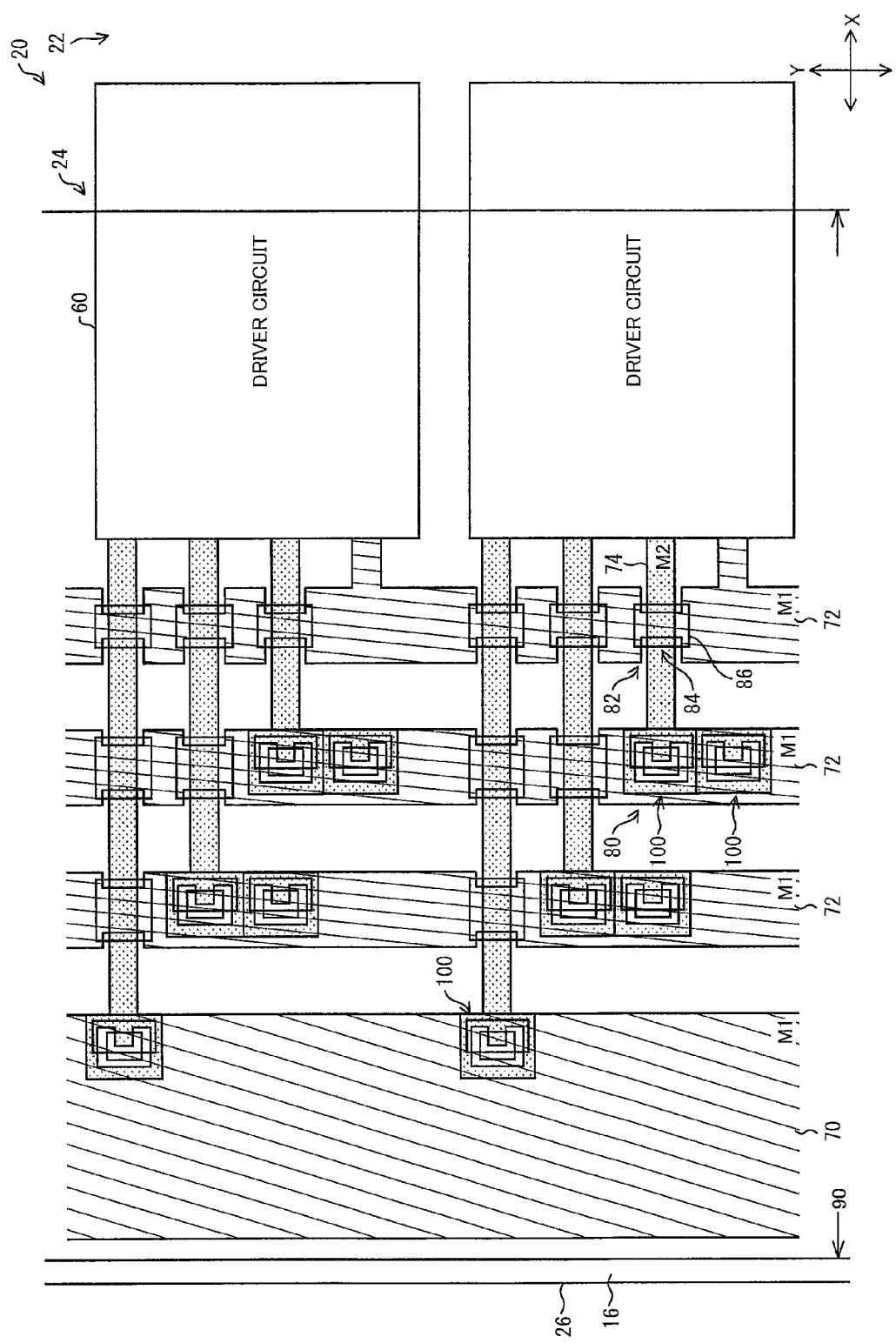
FIG. 8 is a view schematically illustrating a configuration of a TFT array substrate according to yet still another embodiment of the present invention.

Yet still another embodiment of the present invention is described below, referring to FIG. 8. FIG. 8 is a view schematically illustrating a TFT array substrate 20 of the present embodiment.

For the sake of easy explanation, like reference numbers are given to members having the like functions similar to those explained in each of the aforementioned embodiments, and their explanation is not repeated here.

The TFT array substrate 20 of the present embodiment is different from each TFT array substrate 20 of the aforementioned embodiments in terms of the configuration of the wirings extended in the Y direction. More specifically, at each intersection portion 82, a wiring extended in the Y direction has a narrowed portion 84. The intersection parts 82 are intersections at each of which a wiring extended in the Y direction and a wiring extended in the X direction cross each other without being connected with each other electrically.

As illustrated in FIG. 8, the TFT array substrate 20 of the present embodiment is so configured that each clock wiring 72 is narrowed in width at each intersection at which the clock wiring 72 cross a branch wiring 74. This portion at which the clock wiring 72 (wiring extended in the Y direction) is narrowed in width is the narrowed portion 84. In other words, the narrowed portion 84 is a constricted part of the clock wiring 72.

In the TFT array substrate 20 of the present embodiment, an area in which the clock wirings 72 and the branch wirings 74 overlap at the intersection parts 82 is reduced by providing the narrowed parts 84 to the clock wirings 72.

That is, the wirings extended in the Y directions and the wirings extended in the X directions overlap each other in a smaller area.

With this configuration, capacitance produced between the wirings extended in the Y directions and the wirings extended in the X directions can be reduced at the intersection parts 82.

The reduction in such capacitance may lead to circuit output characteristics improvement such as inhibition of signal delay.

As to a way of narrowing the wiring width, the present invention is not limited particularly. That is, the wiring may be narrowed from both sides, or may be narrowed from one side. Moreover, the wiring may be substantially narrowed by having a void portion in the vicinity of a middle of its width. In other words, the overlapping area with a wiring extended in the X direction can be reduced by providing a void portion to a wiring overlapping the wiring extended in the X direction.

(Semiconductor Layer)

Moreover, a semiconductor layer 86 may be provided, with which the narrowed parts 84 overlap. By providing the semiconductor layer 86, disconnection with the branch wiring and leakage to signal wiring can be inhibited.

Embodiment 5

Figure 9:
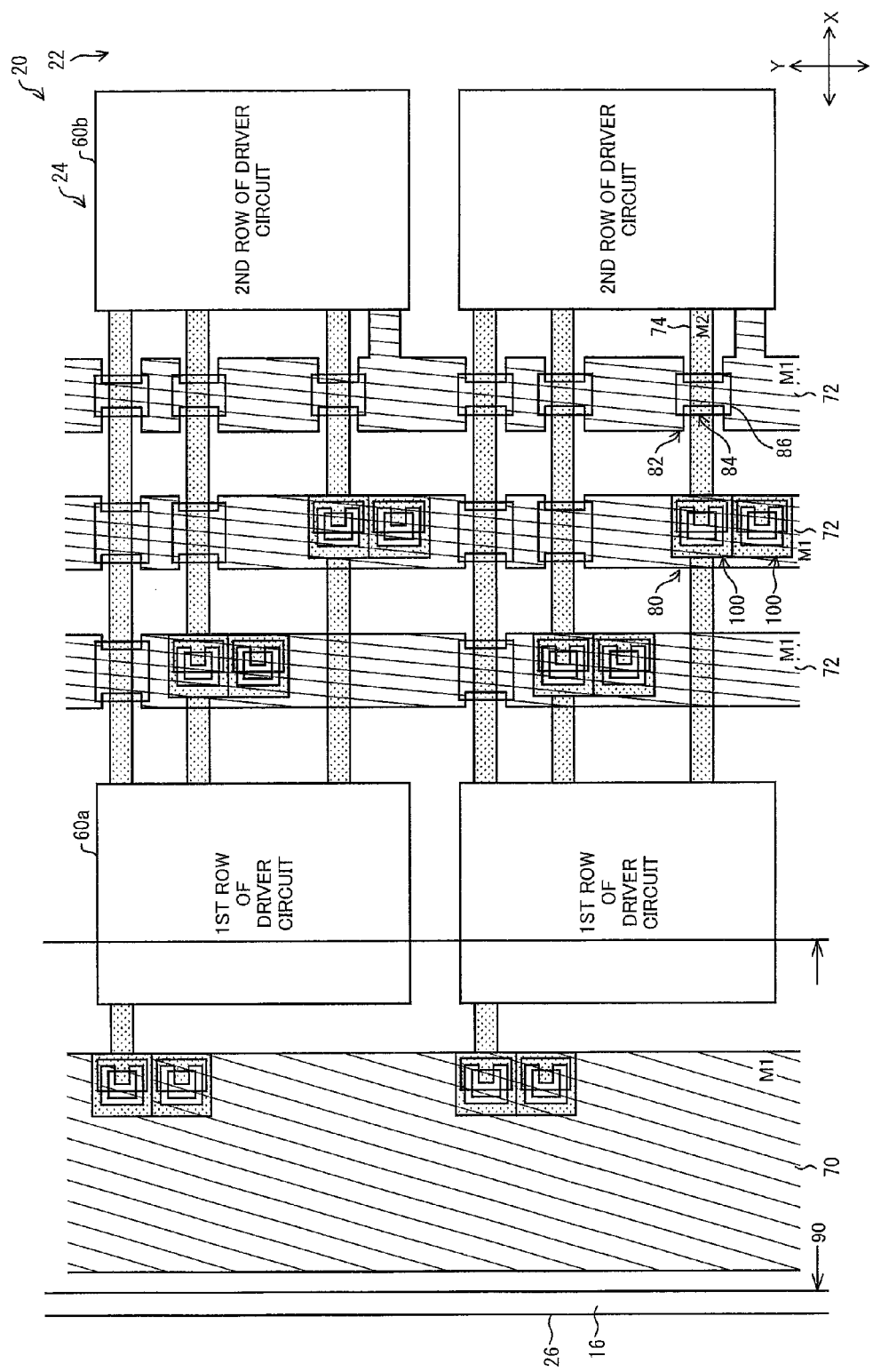
FIG. 9 is a view schematically illustrating a configuration of a TFT array substrate according to further another embodiment of the present invention.
Figure 10:
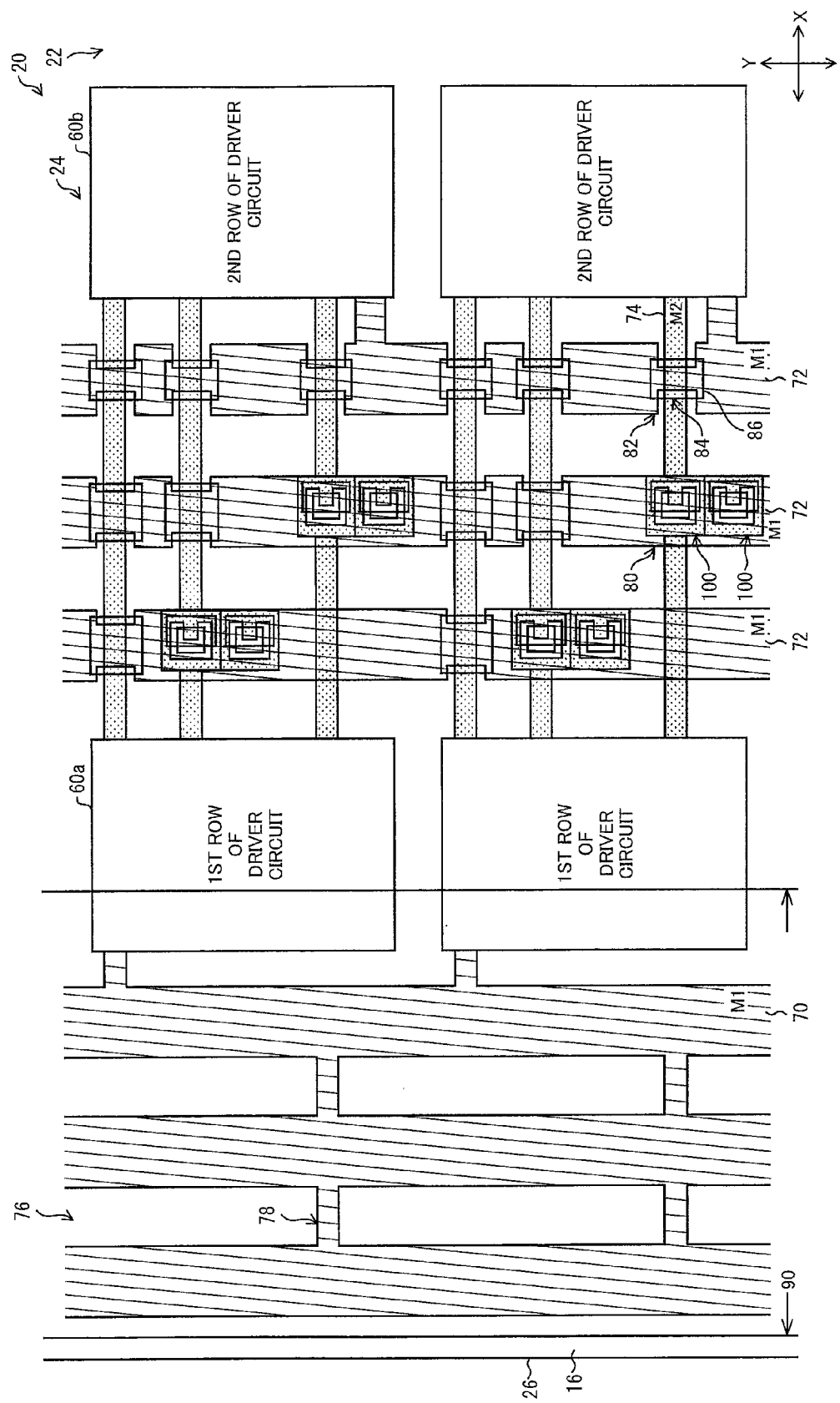
FIG. 10 is a view schematically illustrating a configuration of a TFT array substrate according to further another embodiment of the present invention.

Further another embodiment is described below, referring to FIGS. 9 and 10. FIGS. 9 and 10 are views schematically illustrating TFT array substrates 20 according to further another embodiment of the present invention.

For the sake of easy explanation, like reference numbers are given to members having the like functions similar to those explained in each of the aforementioned embodiments, and their explanation is not repeated here.

The TFT array substrate 20 according to the present embodiment is different from each TFT array substrate 20 according to the aforementioned embodiment in terms of the configuration of the driver circuit 60 and the configuration of the seal 90.

(Driver Circuit)

Firstly, the driver circuit 60 is described below. In each of the aforementioned embodiments, only one row of the driver circuits 60 is provided in the X direction, and there is no driver circuit between the wirings extended in the Y direction in the periphery area 24. That is, the driver circuit 60 is provided in a border area between the periphery area 24 and the display area 22.

On the other hand, the TFT array substrate 20 of the present embodiment is so configured to have two rows of the driver circuits 60 in the X direction. Accordingly, a first row of driver circuits 60a and a second row of driver circuits 60b are aligned in the X direction. More specifically, the first row of driver circuits 60a is provided between a low-potential-side power supply wiring 70 (outer wiring) and a clock wiring 72. The second row of driver circuits 60b is provided in the border area between the display area 22 and the periphery are 24.

In other words, a signal wiring for a scanning line driver circuit is provided between the rows of the driver circuits 60 in an area not covered by the seal 90, that is, between the seal 90 and the display area 22 serving as an active area.

(Seal)

Next, the seal 90 is described below.

In each of the aforementioned embodiments, in the periphery area 24, the seal 90 covers all the wirings extended in the Y direction. More specifically, the low-potential-side power supply wiring 70 and all the clock wirings 72 are covered with the seal 90.

Consequently, the contact holes 100 provided respectively at the connection parts 80 are all covered with the seal 90.

On the other hand, the TFT array substrate 20 according to the present embodiment is so configured that the seal 90 covers the low-potential-side power supply wiring 70 and part of the first row of driver circuits 60a. The clock wirings 72 and the second row of driver circuit 60b are not covered with the seal 90.

Consequently, contact holes provided above the clock wirings 72 are not covered with the seal 90.

With this configuration, the uneven cell thickness is further inhibited in the TFT array substrate 20 of the present embodiment, because the contact holes 100 covered with the seal 90 can be reduced in number.

Moreover, with this configuration, the signal wiring for the scanning line driver circuit, which signal wiring provided between the first row of driver circuit 60a and the second row of driver circuit 60b, can be narrower in wiring width, thereby making it easier to narrow the frame portion of the liquid crystal display panel.

The effect of the inhibition of uneven cell thickness can be achieved by providing one or more of the wirings extended in the Y direction (for example, the clock wirings 72) between the first row of driver circuits 60a and the second row of driver circuits 60b in the X direction.

Embodiment 6

Figure 11:
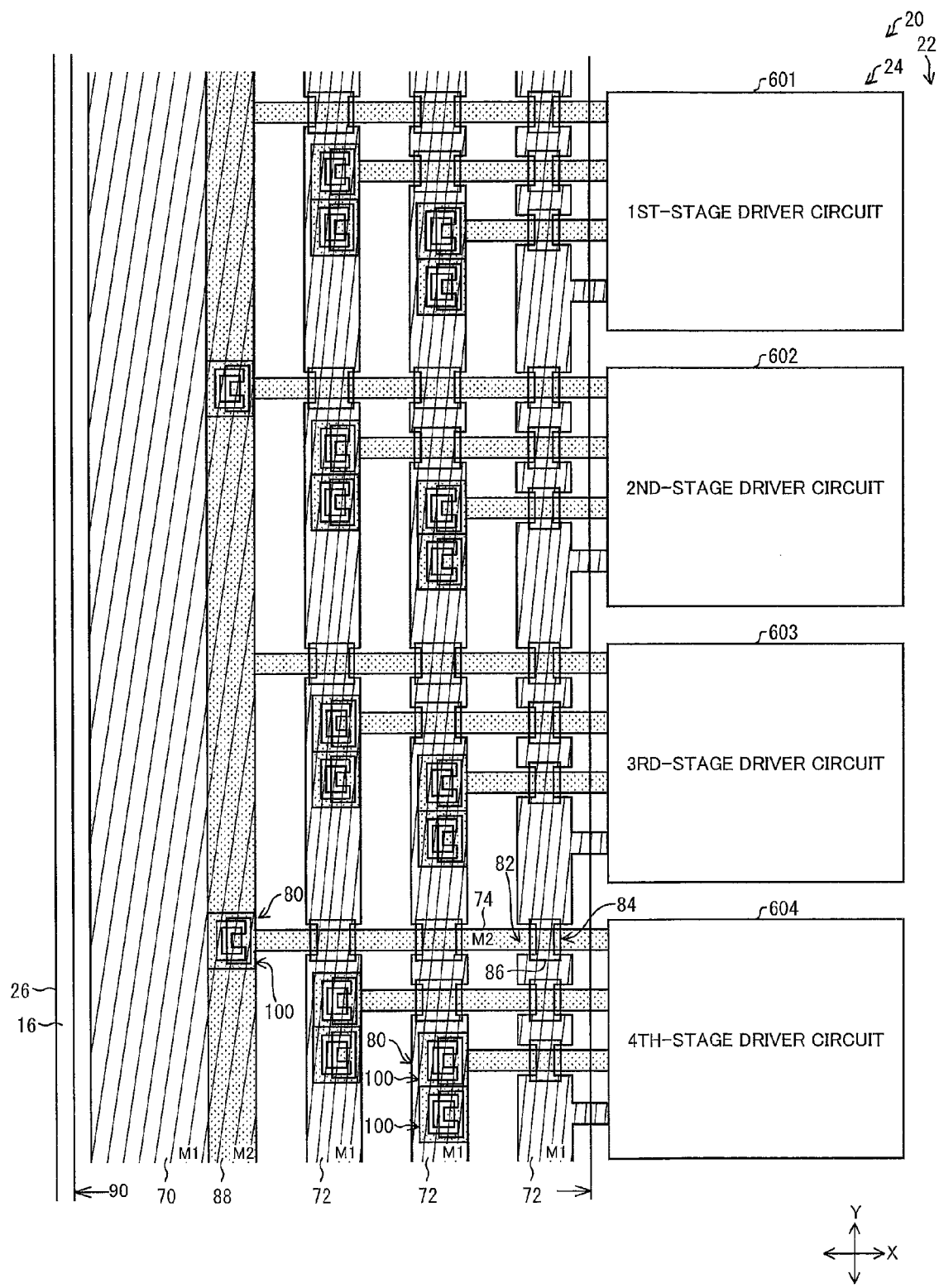
FIG. 11 is a view schematically illustrating a configuration of a TFT array substrate according to yet further another embodiment of the present invention.

Yet further another embodiment of the present invention is described below, referring to FIG. 11. FIG. 11 is a view schematically illustrating configuration of a TFT array substrate 20 according to the present embodiment.

For the sake of easy explanation, like reference numbers are given to members having the like functions similar to those explained in each of the aforementioned embodiments, and their explanation is not repeated here.

The TFT array substrate 20 of the present embodiment is different from each TFT array substrate 20 in the aforementioned embodiment in that a low-potential-side power supply wiring 70 is overlapped by some branch wirings 74. More specifically, the branch wiring 74 extended in the X direction so as to overlap the low-potential-side power supply wiring 70 is further extended in the Y direction above the low-potential-side power supply wiring 70. That portion of the branch wiring 74 which is extended in the Y direction above the low-potential-side power supply wiring 70 is referred to as a branch wiring extension portion 88.

In other words, the TFT array substrate 20 according to the present embodiment is configured such that the area in which the low-potential-side power supply wiring 70 (outer wiring) is provided includes multi metal wiring layers by laminating the first metal material, the second metal material, and the third metal material therein.

By providing the branch wiring extension portion 88 as described above, it becomes possible that the number of the contact holes 100 is less than the number of the driver circuits 60. In other words, the number of the contact holes provided for the low-potential-side power supply wiring 70 (outer wiring) can be less than the number of the wirings (branch wiring such as the branch wirings 74) branched out of the low-potential-side power supply wiring 70.

That is, without the branch wiring extension portion 88, it is necessary that each driver circuit 60 (such as first-stage driver circuit 601, second-stage driver circuit 602, third-stage driver circuit 603, fourth-stage driver circuit 604) be provided with a contact hole 100 so as to allow a branch wiring 74 and the low-potential-side power supply wiring 70 to be connected with each other.

On the other hand, with the branch wiring extension portion 88, the branch wirings 74 respectively corresponding to the driver circuits 60 are electrically connected with the low-potential-side power supply wiring 70 via the branch wiring extension portion 88 provided on the low-potential-side power supply wiring 70. With this configuration, by connecting with the low-potential-side power supply wiring 70 one branch wiring 74 corresponding to any one of the driver circuits 60 via the contact hole 100, the branch wiring(s) 74 corresponding to the other one(s) of the driver circuits 60 is connected with the low-potential-side power supply wiring 70. By this, the number of the contact holes 100 can be reduced.

In the example illustrated in FIG. 11, the branch wiring 74 corresponding to the second-stage driver circuit 602 and the branch wiring 74 corresponding to the fourth-stage driver circuit 604 are electrically connected with the low-potential-side power supply wiring 70 via the contact holes 100, respectively. Meanwhile, the branch wiring 74 corresponding to the first-stage driver circuit 601 and the branch wiring 74 corresponding to the third-stage driver circuit 603 are connected with the branch wiring extension portion 88, thereby being connected with the low-potential-side power supply wiring 70 but not being connected therewith directly via the contact holes 100.

With this configuration, it is possible to reduce the number of the contact holes provided under the seal 90. Thereby, it becomes possible to further inhibit the display quality deterioration caused by the uneven cell thickness.

The TFT array substrate 20 according to the present embodiment may be so configured that the low-potential-side power supply wiring 70, which is an outer wiring closer to the substrate edge 26, has a ladder-like shape as illustrated in FIG. 6 or 7.

Moreover, in addition to the aforementioned configuration, a connection conductor extension portion of the connection conductor 102 may be provided on and along the low-potential-side power supply wiring 70 (serving as a main wiring), i.e., in an upper layer on the low-potential-side power supply wiring 70, like the branch wiring extension portion 88.

In this configuration, the branch wirings 74 may be formed from a material identical with that of the main wiring such as the low-potential-side power supply wiring 70, thereby making it possible to electrically connect the branch wirings 74 with the main wiring without the need of the contact holes 100.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

A similar configuration may be adopted in a periphery area in which the signal wiring for a signal (source) driver circuit is provided, even though the above explanation discusses an example in which the configuration is applied to the periphery area in which the scanning wiring for a signal (gate) driver circuit is provided.

Furthermore, the above explanation discusses an exemplary configuration in which the void parts 76 are provided to the low-potential-side power supply wiring 70. Where to provide the void parts 76 is not limited to the low-potential-side power supply wiring 70, and the clock wiring 72 may have void parts 76, for example. Moreover, apart from the wirings extended in the Y direction, a wiring extended in the X direction, such as the branch wiring 74, may have such void parts 76.

While the above explanation discusses an exemplary configuration in which the clock wiring 72 has the narrowed parts 84. Where to provide the narrowed portion 84 is not limited to the clock wiring 72. Apart from the wirings extended in the Y direction, a wiring extended in the X direction, such as the branch wiring 74, may have such narrowed parts 84.

Moreover, the above explanation discusses an exemplary configuration in which the main wirings are formed from the first metal material M1 from which the gate bus lines 42 are formed, and the branch wirings are formed from the second metal material M2 from which the source bus lines 44 are formed. The present invention is not limited to this combination of the wirings and the metal materials, and may be such that the first metal material M1 and the second metal material M2 are exchanged to form these wirings, for example.

Moreover, in the above explanation, the driver circuits are exemplified as the circuits that, in the periphery area of the insulating substrate, are connected with the main wirings via the branch wirings. The present invention is not limited to the driver circuits in terms of the circuits or element to be connected with the main wirings via the branch wirings, and may be so configured, for example, that the circuits or element to be connected with the main wirings via the branch wirings are peripheral TFT elements provided in the periphery area in order to drive the TFT elements provided in the display area.

Moreover, a TFT array substrate according to the present invention may be so configured that the main wiring is formed from the first metal material; the branch wirings is formed from the second metal material; and at least one of the connection parts is such that a whole of the branch-wiring via hole overlaps with the main wiring in a plane view.

Moreover, a TFT array substrate according to the present invention may be so configured that the periphery area is provided with a plurality of the main wirings; and the main wirings except one closest to a substrate edge of the insulating substrate are identical in wiring width.

Moreover, a TFT array substrate according to the present invention may be so configured that the periphery area is provided with a plurality of the main wirings; and the plurality of the main wirings are identical in wiring width.

In there configurations, and the main wirings except one closest to a substrate edge of the insulating substrate or all of the main wirings are identical in wiring width.

This makes it easier to attain uniform wiring density in the peripheral area. Therefore, it is easier to prevent the uneven cell thickness, for example, in the case where the seal is provided in the periphery area. Therefore, it is easy to prevent the display quality deterioration in the TFT array substrate with any of there configurations.

Moreover, a TFT array substrate according to the present invention may be so configured that the main wiring closest to the substrate edge of the insulating substrate is greater in wiring width than the main wirings except the one closest to the substrate edge of the insulating substrate.

Moreover, a TFT array substrate according to the present invention may be so configured that the main wiring closest to the substrate edge of the insulating substrate is a low-potential-side power supply wiring.

Moreover, a TFT array substrate according to the present invention may be so configured that the main wiring closest to the substrate edge of the insulating substrate has void parts.

Moreover, a TFT array substrate according to the present invention may be so configured that at the connection parts in a plane view, the connection conductor is provided on the main wiring or main wirings without being off the main wiring or the main wirings.

With this configuration, the connection conductor is provided only on the main wiring at the connection part in a plane view. That is, there is the main wiring under the connection conductor.

Consequently, the TFT array substrate with this configuration is such that a particular metal material layer is present under the whole connection conductor. This makes it possible to prevent the uneven cell thickness more effectively.

Moreover, a TFT array substrate according to the present invention may be so configured that the connection parts each have a main-wiring via hole through which the main wiring or corresponding one of the main wirings is exposed, which is covered with the connection conductor; the branch-wiring via hole allows the corresponding one of the branch wirings to be electrically connected with the connection conductor; and the main-wiring via hole allows the main wiring or the corresponding one of the main wirings to be electrically connected with the connection conductor.

In this configuration, the connection part has two via holes thereby allowing the main wiring and the branch wiring to be connected with each other.

Therefore, it is easy to connect the main wiring with the branch wiring surely.

Moreover, a TFT array substrate according to the present invention may be so configured that in addition to the corresponding one of the branch wirings, the branch-wiring via hole also exposes the main wiring or corresponding one of the main wirings, which is covered with the connection conductor; and at the branch-wiring via hole, the corresponding one of the branch wirings is electrically connected with the main wiring or the corresponding one of the main wirings.

In this configuration, the connection part has only one via hole. As a result, it is possible to reduce the number of the contact holes provided to the via holes.

Furthermore, it become easy to prevent the uneven cell thickness at the connection part.

Moreover, a TFT array substrate according to the present invention may be so configured that in the periphery area, at least either of the main wiring(s) or the branch wirings has/have void parts in which no metal material is present.

This configuration changes an effective wiring width, thereby easily providing the wiring with a desired resistance or the like.

Furthermore, in case where a light-curable resin or the like is provided to the periphery area, this configuration makes it easy to perform uniform irradiation of light to the resin. Accordingly, it becomes easy to cure the resin surely.

Moreover, a TFT array substrate according to the present invention may be so configured that the periphery area is provided with intersection parts at which the main wiring(s) respectively crosses the branch wirings without being electrically connected with the branch wirings; and at the intersection parts, at least either of the main wiring(s) or the branch wirings has/have a narrowed part at which a wiring width thereof is narrowed.

With this configuration, it is possible to reduce an area in which the main wiring and the branch wiring overlap with each other.

As a result, it becomes possible to reduce capacitance produced between the main wiring and branch wiring. Consequently, it becomes easy to prevent signal delay or the like in the wirings, thereby making it easier to improve circuit output characteristics.

Moreover, a TFT array substrate according to the present invention may be so configured that the periphery area is provided with the plural branch wirings; the branch wirings have and are electrically connected with a branch wiring extension part extended on and along the main wiring or corresponding one of the main wirings.

Moreover, a TFT array substrate according to the present invention may be so configured that the periphery area is provided with the plural branch wirings; the branch wirings have and are electrically connected with a branch wiring extension part extended on and along a first main wiring, the first main wiring being the main wiring or corresponding one of the main wirings, whereby a number of the connection parts provided on the first main wiring is less than a number of the branch wirings.

Moreover, a TFT array substrate according to the present invention may be so configured that the connection conductor has a connection conductor extension part on and along the first main wiring.

In these configurations, the main wirings and the plurality of the branch wirings are connected with each other via the branch wiring extension part or the connection conductor extension part, wherein the branch wiring extension part is a portion of the branch wirings which portion is extended along the main wiring, and the connection conductor extension part is a portion of the connection part which portion is extended along the main wiring.

These configurations make it possible to reduce the number of the connection parts at which the main wiring and the branch wirings are connected with each other correspondingly. Thereby, it becomes easy to prevent the uneven cell thickness in the periphery area.

Moreover, a TFT array substrate according to the present invention may be so configured that in the periphery area, at least some of the driver circuits are provided between the connection parts and a substrate edge of the insulating substrate.

Moreover, a TFT array substrate according to the present invention may be so configured that in the periphery area, at least some of the periphery TFT elements are provided between the connection parts and a substrate edge of the insulating substrate.

In these configurations, at least some of the driver circuits or the periphery TFT elements are provided between the connection parts and one substrate edge of the insulating substrate.

As a result, in case where a resin such as the seal or the like is provided in a region of a certain width from the substrate edge, it becomes easy to reduce the number of the connection parts that are covered by the resin.

Consequently, it becomes easy to prevent the uneven cell thickness in the periphery area.

Moreover, a TFT array substrate according to the present invention may be so configured that in the periphery area, at least some of the driver circuits are provided between the connection parts and a substrate edge of the insulating substrate; and between the at least some of the driver circuits and the rest of the driver circuits, a main wiring is provided and this main wiring is a clock wiring.

Moreover, a TFT array substrate according to the present invention may be so configured that in the periphery area, at least some of the periphery TFT elements are provided between the connection parts and a substrate edge of the insulating substrate; and between the at least some of the periphery TFT elements and the rest of the periphery TFT elements, a main wiring is provided and this main wiring is a clock wiring.

Moreover, a liquid crystal display panel according to the present invention is a liquid crystal display panel comprising: a TFT array substrate as mentioned above; and a counter substrate, being assembled with the TFT array substrate by a seal, the seal being provided in the periphery area.

Moreover, a liquid crystal display panel according to the present invention may be configured such that the connection parts is under the seal.

With this configuration, it becomes easy to give a uniform thickness to the seal provided in the periphery area.

This makes it possible to prevent the display quality deterioration caused by the uneven cell thickness.

Moreover, a liquid crystal display panel according to the present invention may be configured such that the connection parts is under the seal.

INDUSTRIAL APPLICABILITY

The present invention makes it possible to prevent display quality deterioration, an is suitable applicable to liquid crystal display apparatuses etc., in which high quality display is required.

REFERENCE SIGNS LIST

10: Liquid Crystal Display Panel
16: Insulating Substrate
20: TFT Array Substrate
22: Display Area
24: Periphery Area
26: Substrate Edges
42: Gate Bus Lines
44: Source Bus Lines
48: Pixel Electrodes
60: Driver Circuits
70: Low-Potential-Side Power Supply Wiring (Main Wiring)
72: Clock Wirings (Main Wiring)
74: Branch Wirings (Branch Wiring)
76: Void Parts
80: Connection Parts
82: Intersection Parts
84: Narrowed Parts
88: Branch Wiring Extension Portion
90: Seal
102: Connection Conductor
110: Main-wiring via holes
112: Branch-wiring via holes
114: Single Via Holes

The invention claimed is:

1. A TFT array substrate, in which TFT elements and pixel electrodes being correspondingly connected with the TFT elements are arrayed in matrix on an insulating substrate, the TFT array substrate comprising:
   gate bus lines on the insulating substrate, the gate bus lines being correspondingly connected with the TFT elements and being formed from a first conductive material; and
   source bus lines on the insulating substrate, the source bus lines being correspondingly connected with the TFT elements and being formed from a second conductive material, the pixel electrodes being made from a third conductive material, the insulating substrate having a display area in which the pixel electrodes are arrayed in matrix, and a periphery area around the display area, the periphery area being provided with driver circuits for driving the TFT elements corresponding thereto, the periphery area being provided with (i) first branch wirings of a plurality of branch wirings being correspondingly connected with the driver circuits, and (ii) a main wiring being connected with the first branch wirings, the first branch wirings being formed from one of the first conductive material and the second conductive material, the main wiring being formed from the other one of the first conductive material and the second conductive material, the periphery area being provided with connection parts, at which the main wiring is connected with the respective first branch wirings, at each of the connection parts, a connection conductor electrically connecting the main wiring with corresponding one of the first branch wirings, the connection conductor being formed from the third conductive material, the connection parts each having a branch-wiring via hole in an insulating film on the corresponding one of the first branch wirings, the branch-wiring via hole allowing the corresponding one of the first branch wirings to be electrically connected with the connection conductor, at least one of the connection parts being such that at least part of the branch-wiring via hole overlaps with the main wiring in a plane view, and each of the first branch wirings is electrically connected with a branch wiring extension part extended on and along the main wiring.

2. The TFT array substrate as set forth in claim 1, wherein:
the main wiring is formed from the first conductive material;
the first branch wirings are formed from the second conductive material; and
at least one of the connection parts is such that a whole of the branch-wiring via hole overlaps with the main wiring in a plane view.

3. The TFT array substrate as set forth in claim 1, wherein:
the periphery area is provided with a plurality of the main wirings; and
the main wirings except one closest to a substrate edge of the insulating substrate are identical in wiring width.

4. The TFT array substrate as set forth in claim 3, wherein:
the main wiring closest to the substrate edge of the insulating substrate is greater in wiring width than the main wirings except the one closest to the substrate edge of the insulating substrate.

5. The TFT array substrate as set forth in claim 3, wherein:
the main wiring closest to the substrate edge of the insulating substrate is a low-potential-side power supply wiring.

6. The TFT array substrate as set forth in claim 1, wherein:
the periphery area is provided with a plurality of the main wirings; and
the plurality of the main wirings are identical in wiring width.

7. The TFT array substrate as set forth in claim 1, wherein:
at the connection parts in a plane view, the connection conductor is provided on the main wiring without being off the main wiring.

8. The TFT array substrate as set forth in claim 1, wherein:
the connection parts each have a main-wiring via hole in an insulating film on the main wiring; and
the main-wiring via hole allows the main wiring to be electrically connected with the connection conductor.

9. The TFT array substrate as set forth in claim 1, wherein:
the connection parts each have a single via hole, the single via hole being a via hole in which a main-wiring via hole in an insulating film on the main wiring and branch-wiring via hole are unified,
at the single via hole, the corresponding one of the first branch wirings is electrically connected with the main wiring.

10. The TFT array substrate as set forth in claim 1, wherein:
in the periphery area, at least either of the main wiring or the first branch wirings has/have void parts in which no conductive material is present.

11. The TFT array substrate as set forth in claim 1, wherein:
the periphery area is provided with intersection parts at which the main wiring respectively crosses the first branch wirings without being electrically connected with the first branch wirings; and
at the intersection parts, at least either of the main wiring or the first branch wirings has/have a narrowed part at which a wiring width thereof is narrowed.

12. The TFT array substrate as set forth in claim 1, wherein:
a number of the connection parts provided on the main wiring is less than a number of the first branch wirings.

13. The TFT array substrate as set forth in claim 1, wherein the connection conductor has a connection conductor extension part on and along the main wiring.

14. The TFT array substrate as set forth in claim 1, wherein:
in the periphery area, at least some of the driver circuits are provided between the connection parts and a substrate edge of the insulating substrate.

15. The TFT array substrate as set forth in claim 14, wherein:
in the periphery area, at least some of the driver circuits are provided between the connection parts and a substrate edge of the insulating substrate; and
between the at least some of the driver circuits and the rest of the driver circuits, a main wiring is provided and the main wiring between the at least some of the driver circuits and the rest of the driver circuits is a clock wiring.

16. A liquid crystal display panel comprising:
the TFT array substrate as set forth in claim 1; and
a counter substrate, being assembled with the TFT array substrate by a seal, the seal being provided in the periphery area.

17. The liquid crystal display panel as set forth in claim 16, wherein the connection parts are under the seal.

18. The liquid crystal display panel as set forth in claim 16, wherein the seal is cured by using UV light.

19. The TFT array substrate as set forth in claim 12, wherein the connection conductor has a connection conductor extension part on and along the main wiring.

20. The TFT array substrate of claim 1, wherein the branch wiring extension part is a single branch wiring extension part.

21. The TFT array substrate of claim 1, wherein
the first conductive material includes aluminum, molybdenum or tantalum,
the second conductive material includes aluminum, molybdenum, tantalum or titanium, and
the third conductive material is indium tin oxide.

22. A TFT array substrate in which TFT elements and pixel electrodes being correspondingly connected with the TFT elements are arrayed in matrix on an insulating substrate, the TFT array substrate comprising:

gate bus lines on the insulating substrate, the gate bus lines being correspondingly connected with the TFT elements and being formed from a first conductive material; and source bus lines on the insulating substrate, the source bus lines being correspondingly connected with the TFT elements and being formed from a second conductive material, the pixel electrodes being made from a third conductive material, the insulating substrate having a display area in which the pixel electrodes are arrayed in matrix, and a periphery area around the display area, the periphery area being provided with periphery TFT elements for driving the TFT elements corresponding thereto, the periphery area being provided with (i) first branch wirings of a plurality of branch wirings being correspondingly connected with the periphery TFT elements, and (ii) a main wiring being connected with the first branch wirings, the first branch wirings being formed from one of the first conductive material and the second conductive material, the main wiring being formed from the other one of the first conductive material and the second conductive material, the periphery area being provided with connection parts, at which the main wiring is connected with the respective first branch wirings, at each of the connection parts, a connection conductor electrically connecting the main wiring with corresponding one of the first branch wirings, the connection conductor being formed from the third conductive material, the connection parts each having a branch-wiring via hole in an insulating film on the corresponding one of the first branch wirings, the branch-wiring via hole allowing the corresponding one of the first branch wirings to be electrically connected with the connection conductor, at least one of the connection parts being such that at least part of the branch-wiring via hole overlaps with the main wiring in a plane view, and each of the first branch wirings is electrically connected with a branch wiring extension part extended on and along the main wiring.

23. The TFT array substrate as set forth in claim 22, wherein:

in the periphery area, at least some of the periphery TFT elements are provided between the connection parts and a substrate edge of the insulating substrate.

24. The TFT array substrate as set forth in claim 23, wherein:

in the periphery area, at least some of the periphery TFT elements are provided between the connection parts and a substrate edge of the insulating substrate; and between the at least some of the periphery TFT elements and the rest of the periphery TFT elements, a main wiring is provided and the main wiring between the at least some of the driver circuits and the rest of the driver circuits is a clock wiring.

25. The TFT array substrate as set forth in claim 22, wherein:

the main wiring is formed from the first conductive material;

the first branch wirings are formed from the second conductive material; and at least one of the connection parts is such that a whole of the branch-wiring via hole overlaps with the main wiring in a plane view.

26. The TFT array substrate as set forth in claim 22, wherein:

the periphery area is provided with a plurality of the main wirings; and the main wirings except one closest to a substrate edge of the insulating substrate are identical in wiring width.

27. The TFT array substrate as set forth in claim 26, wherein:

the main wiring closest to the substrate edge of the insulating substrate is greater in wiring width than the main wirings except the one closest to the substrate edge of the insulating substrate.

28. The TFT array substrate as set forth in claim 26, wherein:

the main wiring closest to the substrate edge of the insulating substrate is a low-potential-side power supply wiring.

29. The TFT array substrate as set forth in claim 22, wherein:

the periphery area is provided with a plurality of the main wirings; and the plurality of the main wirings are identical in wiring width.

30. The TFT array substrate as set forth in claim 22, wherein:

at the connection parts in a plane view, the connection conductor is provided on the main wiring without being off the main wiring.

31. The TFT array substrate as set forth in claim 22, wherein:

the connection parts each have a main-wiring via hole in an insulating film on the main wiring;

the main-wiring via hole allows the main wiring to be electrically connected with the connection conductor.

32. The TFT array substrate as set forth in claim 22, wherein:

the connection parts each have a single via hole, the single via hole being a via hole in which a main-wiring via hole in an insulating film on the main wiring and branch-wiring via hole are unified, at the single via hole, the corresponding one of the first branch wirings is electrically connected with the main wiring.

33. The TFT array substrate as set forth in claim 22, wherein:

in the periphery area, at least either of the main wiring or the first branch wirings has/have void parts in which no conductive material is present.

34. The TFT array substrate as set forth in claim 22, wherein:

the periphery area is provided with intersection parts at which the main wiring respectively crosses the first branch wirings without being electrically connected with the first branch wirings; and at the intersection parts, at least either of the main wiring or the first branch wirings has/have a narrowed part at which a wiring width thereof is narrowed.

35. The TFT array substrate as set forth in claim 22, wherein:

a number of the connection parts provided on the main wiring is less than a number of the first branch wirings.

36. The TFT array substrate as set forth in claim 22, wherein the connection conductor has a connection conductor extension part on and along the main wiring.

37. The TFT array substrate as set forth in claim 35, wherein the connection conductor has a connection conductor extension part on and along the main wiring.

38. A liquid crystal display panel comprising:
the TFT array substrate as set forth in claim 22; and
a counter substrate, being assembled with the TFT array substrate by a seal, the seal being provided in the periphery area.

39. The liquid crystal display panel as set forth in claim 38, wherein the connection parts are under the seal.

40. The liquid crystal display panel as set forth in claim 38, wherein the seal is cured by using UV light.

41. The TFT array substrate of claim 22, wherein the branch wiring extension part is a single branch wiring extension part.

42. The TFT array substrate of claim 22, wherein
the first conductive material includes aluminum, molybdenum or tantalum,
the second conductive material includes aluminum, molybdenum, tantalum or titanium, and
the third conductive material is indium tin oxide.

* * * * *